United States Patent
Shim

(10) Patent No.: US 12,323,718 B2
(45) Date of Patent: Jun. 3, 2025

(54) IMAGE SENSOR, METHOD OF OPERATING THE IMAGE SENSOR, AND IMAGE PROCESSING DEVICE

(71) Applicant: Samsung Electronics Co., Ltd., Suwon-si (KR)

(72) Inventor: Eunsub Shim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 108 days.

(21) Appl. No.: 18/456,853

(22) Filed: Aug. 28, 2023

(65) Prior Publication Data
US 2024/0121526 A1 Apr. 11, 2024

(30) Foreign Application Priority Data
Oct. 11, 2022 (KR) .......................... 10-2022-0129754

(51) Int. Cl.
*H04N 25/67* (2023.01)
*H03M 1/56* (2006.01)
*H04N 25/571* (2023.01)
*H04N 25/709* (2023.01)
(Continued)

(52) U.S. Cl.
CPC .............. *H04N 25/67* (2023.01); *H03M 1/56* (2013.01); *H04N 25/571* (2023.01);
(Continued)

(58) Field of Classification Search
CPC .... H04N 25/67; H04N 25/571; H04N 25/709; H04N 25/771; H04N 25/78;
(Continued)

(56) References Cited

U.S. PATENT DOCUMENTS 6,307,195 B1 * 10/2001 Guidash ................ H10F 39/803
348/308
7,119,317 B2 10/2006 Ando et al.
(Continued)

FOREIGN PATENT DOCUMENTS

JP 2012124835 A * 6/2012 ............. H04N 5/357

OTHER PUBLICATIONS

Hara, Kunihiko, et al. "A Linear-Logarithmic CMOS Sensor with Offset Calibration Using an Injected Charge Signal." *ISSCC. 2005 IEEE International Digest of Technical Papers. Solid-State Circuits Conference, 2005*. IEEE, 2005 (pp. 354-355, 603).

*Primary Examiner* — Nhan T Tran
(74) *Attorney, Agent, or Firm* — Harness, Dickey & Pierce, P.L.C.

(57) ABSTRACT

An image sensor includes a pixel array, an analog-to-digital conversion circuit, and an image signal processor. A pixel of the pixel array generates a first analog signal based on a quantity of charge accumulated during a first exposure time and generate a second analog signal based on a quantity of charge accumulated during a shorter second exposure time. The analog-to-digital conversion circuit may generate a first digital signal based on the first analog signal and a first ramp signal and may generate a second digital signal based on the second analog signal and a second ramp signal. The image signal processor may generate image data based on the first and second digital signals. The first ramp signal may be different from the second ramp signal in terms of at least one of a ramping time or a ramping start voltage level.

20 Claims, 26 Drawing Sheets

(51) Int. Cl.
*H04N 25/76* (2023.01)
*H04N 25/771* (2023.01)
*H04N 25/78* (2023.01)

(52) U.S. Cl.
CPC ......... *H04N 25/709* (2023.01); *H04N 25/771* (2023.01); *H04N 25/78* (2023.01); *H04N 25/7795* (2023.01)

(58) Field of Classification Search
CPC .. H04N 25/7795; H04N 23/741; H04N 25/57; H04N 25/62; H04N 25/589; H04N 25/59; H04N 25/60; H04N 25/766; H04N 25/772; H03M 1/56; H03M 1/123; H03M 1/1295; H03M 1/0697; H03M 1/1235
See application file for complete search history.

(56) References Cited

U.S. PATENT DOCUMENTS

| | | | |
|---|---|---|---|
| 7,598,994 B2 | 10/2009 | Kamon | |
| 7,645,978 B2 | 1/2010 | Kamon | |
| 7,746,398 B2 | 6/2010 | Takayanagi | |
| 7,880,778 B2 | 2/2011 | Kamon | |
| 8,134,624 B2 | 3/2012 | Solhusvik et al. | |
| 9,264,633 B2 | 2/2016 | Bae et al. | |
| 9,426,395 B2 | 8/2016 | Jakobson et al. | |
| 9,892,487 B1 | 2/2018 | Wong | |
| 9,894,296 B1* | 2/2018 | Wong | H04N 25/573 |
| 10,880,505 B2 | 12/2020 | Toyofuku et al. | |
| 2004/0227109 A1 | 11/2004 | Storm et al. | |
| 2007/0076106 A1* | 4/2007 | Kamon | H04N 25/67 348/294 |
| 2007/0132867 A1 | 6/2007 | Rhee et al. | |
| 2008/0251695 A1* | 10/2008 | Kamon | H04N 25/587 348/E3.018 |
| 2008/0252762 A1* | 10/2008 | Iwamoto | H04N 25/573 348/301 |
| 2008/0303928 A1 | 12/2008 | Kusuda | |
| 2011/0090365 A1 | 4/2011 | Cha et al. | |
| 2012/0305751 A1 | 12/2012 | Kusuda | |

* cited by examiner

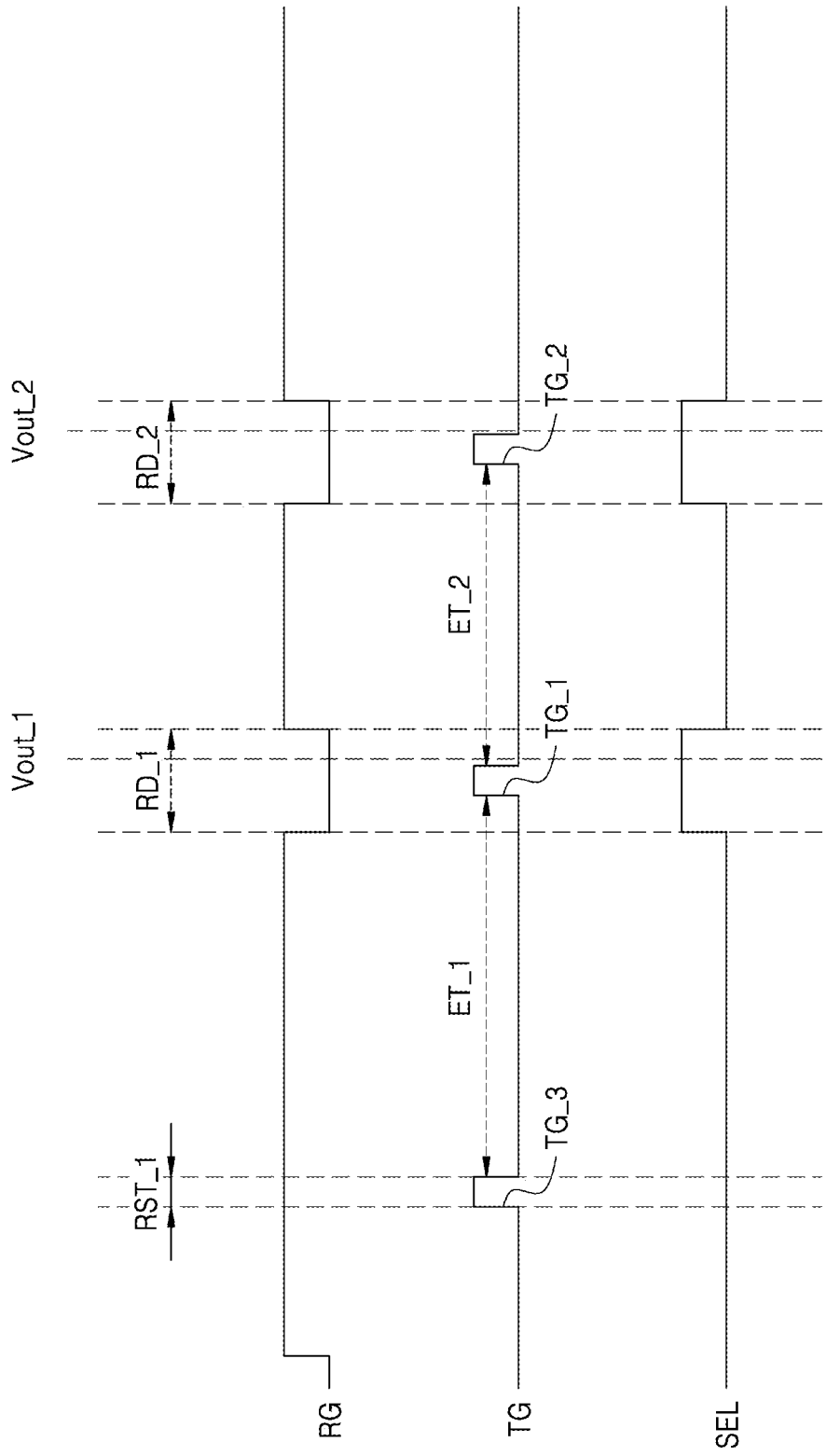

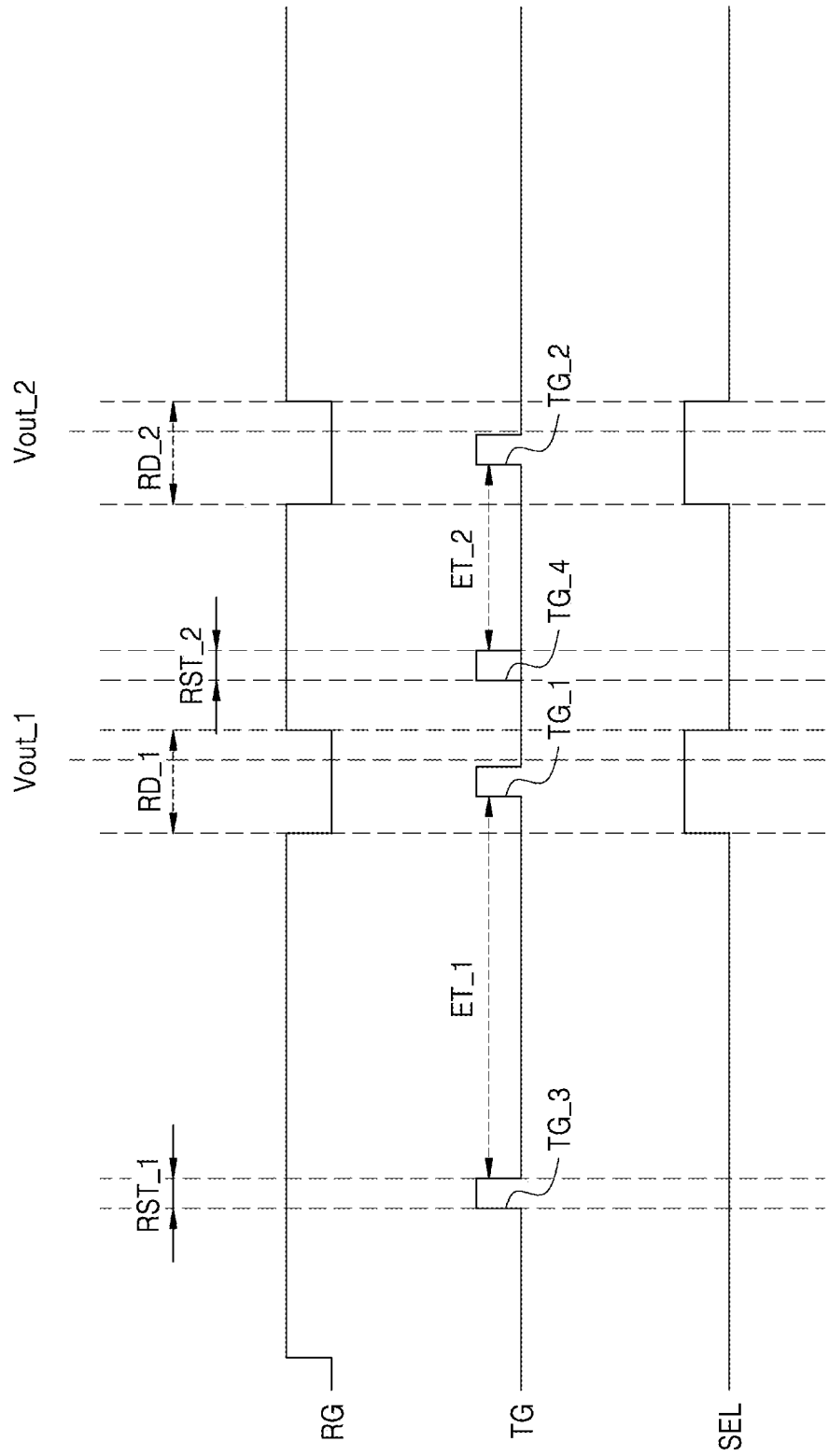

IMAGE SENSOR, METHOD OF OPERATING THE IMAGE SENSOR, AND IMAGE PROCESSING DEVICE

CROSS-REFERENCE TO RELATED APPLICATION

This application is based on and claims priority under 35 U.S.C. § 119 to Korean Patent Application No. 10-2022-0129754, filed on Oct. 11, 2022 in the Korean Intellectual Property Office, the disclosure of which is incorporated by reference herein in its entirety.

BACKGROUND

The inventive concepts relate to image sensors or image processing devices, and more particularly, to image sensors for obtaining an image by generating and/or processing a Lin-Log signal, methods of operating such image sensors, and image processing devices.

Image sensors are devices for capturing (e.g., configured to capture, generate, etc.) 2-dimensional or 3-dimensional images of objects. Image sensors generate images of objects by using photoelectric conversion devices that respond according to the intensity of light reflected by the objects. Along with the recent advancement of complementary metal-oxide semiconductor (CMOS) technology, CMOS image sensors using CMOS s are broadly used. To increase dynamic ranges of image sensors, high dynamic range (HDR) techniques using Lin-Log signals are developed. Further research on image sensors for stably processing Lin-Log signals and methods of operating the image sensors may be required.

SUMMARY

Some example embodiments of the inventive concepts provide an image sensor for preventing gray edge artifacts, which may be generated in obtaining high dynamic range (HDR) images using Lin-Log signals, and/or a method of operating the image sensor.

According to some example embodiments of the inventive concepts, an image sensor may include a pixel array including a plurality of pixels, an analog-to-digital conversion circuit configured to receive an analog signal from the plurality of pixels and transmit a digital signal, and an image signal processor configured to receive the digital signal and generate image data. At least one pixel of the plurality of pixels may be configured to generate a first analog signal based on a first quantity of charge accumulated at the at least one pixel during a first exposure time and generate a second analog signal based on a second quantity of charge accumulated at the at least one pixel during a second exposure time that is shorter than the first exposure time. The analog-to-digital conversion circuit may be configured to generate a first digital signal based on the first analog signal and a first ramp signal and generate a second digital signal based on the second analog signal and a second ramp signal. The image signal processor may be further configured to generate the image data based on the first digital signal and the second digital signal. The first ramp signal may be different from the second ramp signal such that at least one of a ramping time of the first ramp signal or a ramping start voltage level of the first ramp signal is different from a corresponding one of a ramping time of the second ramp signal or a ramping start voltage level of the second ramp signal.

According to some example embodiments of the inventive concepts, a method of operating an image sensor may include accumulating a first photocharge packet in a photoelectric conversion device in response to incident light during a first exposure time, transmitting the first photocharge packet accumulated in the photoelectric conversion device to a floating diffusion node in response to a first transmission control signal, generating a first analog signal based on the first photocharge packet, which is accumulated in the floating diffusion node, and converting the first analog signal into a first digital signal, resetting the floating diffusion node in response to a reset control signal, accumulating a second photocharge packet in the photoelectric conversion device in response to incident light during a second exposure time that is shorter than the first exposure time, transmitting the second photocharge packet accumulated in the photoelectric conversion device to the floating diffusion node in response to a second transmission control signal, and generating a second analog signal based on the second photocharge packet, which is accumulated in the floating diffusion node, and converting the second analog signal into a second digital signal. The converting the first analog signal into the first digital signal may include performing analog-to-digital conversion on a linear signal and a log signal of the first analog signal. The converting the second analog signal into the second digital signal may include performing analog-to-digital conversion on only a linear signal of the second analog signal.

According to some example embodiments of the inventive concepts, an image processing device may include an image sensor and an image signal processor. The image sensor may include a photoelectric conversion device. The image sensor may be configured to generate a first analog signal in a first readout period based on a first quantity of charge accumulated at the image sensor during a first exposure time, generate a second analog signal in a second readout period based on a second quantity of charge accumulated at the image sensor during a second exposure time, generate a first digital signal based on the first analog signal, and generate a second digital signal based on the second analog signal, and the image signal processor may be configured to generate image data based on the first digital signal and the second digital signal. The image sensor may be configured to generate the first digital signal based on a log signal and a linear signal of the first analog signal. The image sensor may be configured to generate the second digital signal based on a linear signal of the second analog signal.

BRIEF DESCRIPTION OF THE DRAWINGS

Example embodiments will be more clearly understood from the following detailed description taken in conjunction with the accompanying drawings in which:

FIG. 7 illustrates a timing diagram of a pixel of an image sensor, according to some example embodiments;

FIG. 8 illustrates a timing diagram of a pixel of an image sensor, according to some example embodiments;

DETAILED DESCRIPTION

Figure 1:
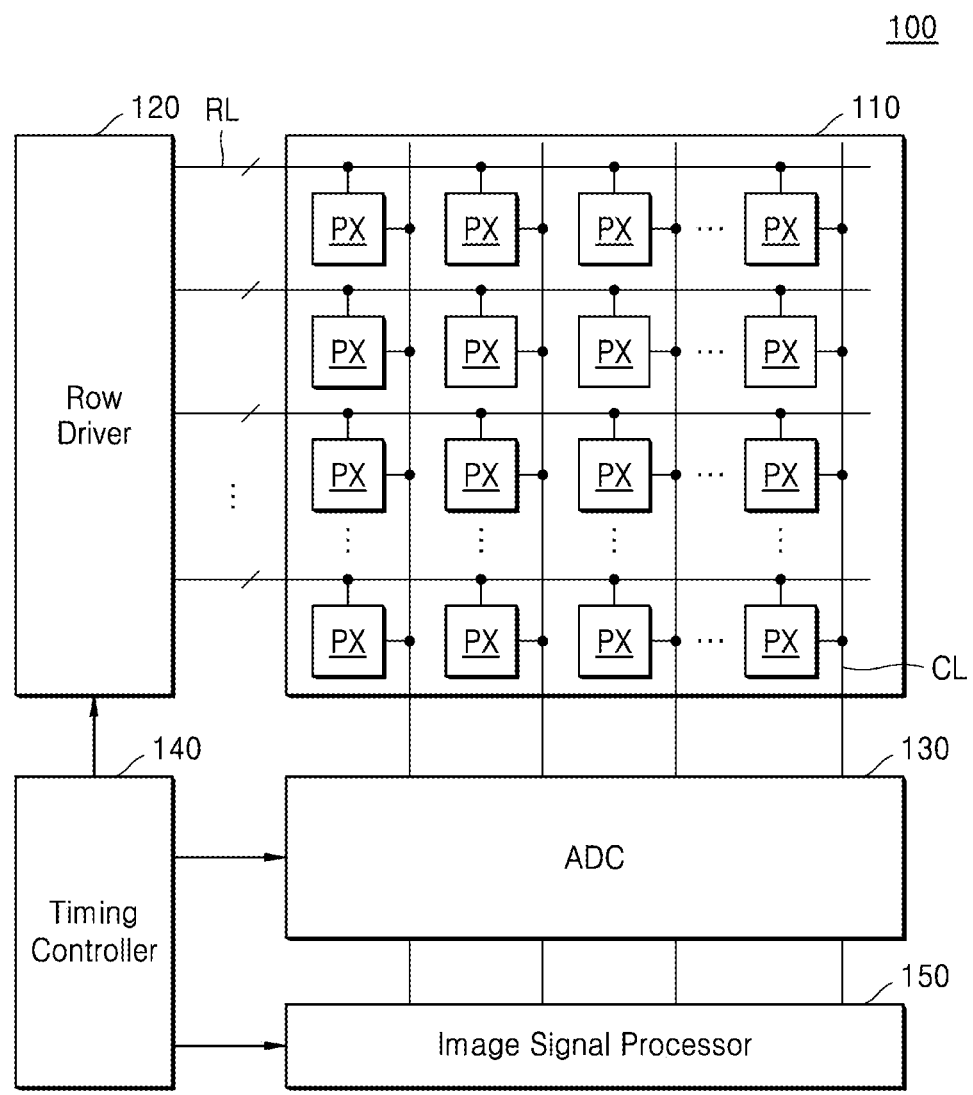
FIG. 1 is a block diagram illustrating an image sensor according to some example embodiments.

Below, some example embodiments of the present inventive concepts will be described in detail and clearly to such an extent that an ordinary one in the art easily implements the present inventive concepts. Below, the term "and/or" is interpreted as including any one of items listed with regard to the term, or a combination of some of the listed items. In this specification, terms indicating an order such as first, and second, are used to distinguish components having the same/similar functions as/to each other, and the first and second may be changed depending on an order in which they are mentioned.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

FIG. 1 is a block diagram illustrating an image sensor according to some example embodiments.

An image sensor 100 may be mounted (e.g., included) in an electronic device having an image or light sensing function (e.g., configured to sense incident light and/or to generate an image based on incident light). For example, the image sensor 100 may be mounted in an electronic device, such as a camera, a smartphone, a wearable device, an Internet-of-Things (IoT) device, a tablet personal computer (PC), a personal digital assistant (PDA), a portable multimedia player (PMP), or a navigation device. In addition, the image sensor 100 may be mounted in an electronic device provided as a component to vehicles, furniture, manufacturing facilities, doors, various measurement devices, or the like.

The image sensor 100 may include a pixel array 110, a row driver 120, an analog-to-digital converter (ADC) circuit 130, and a timing controller 140. The image sensor 100 may further include an image signal processor 150.

The pixel array 110 includes a plurality of row lines RL, a plurality of column lines CL, and a plurality of pixels PX arranged in a matrix form and respectively connected to the plurality of row lines RL and the plurality of column lines CL.

A pixel PX may sense light (e.g., incident light) by using a photoelectric conversion device (e.g., a photoelectric conversion device included in the pixel PX) and may output (e.g., transmit) an image signal that is an electrical signal according to sensed light. The photoelectric conversion device may include a light-sensing device including an organic or inorganic material, such as an inorganic photodiode, an organic photodiode, a perovskite photodiode, a phototransistor, a photogate, a pinned photodiode, or the like.

In the following description, the photoelectric conversion device may be referred to as, but is not limited to, a photodiode PD.

In some example embodiments, the pixel array 110 may generate a first analog signal and a second analog signal, respectively based on the quantities of charge generated and accumulated in the photodiode PD during two exposure times ET_1 and ET_2 in one frame. Accordingly, one piece of image data may be generated based on the first analog signal and the second analog signal, in one frame period, and at least one of the first analog signal or the second analog signal may include a Lin-Log signal. The Lin-Log signal may refer to an analog signal having a linear signal and a log signal. The one piece of image data, which is generated based on the first analog signal and the second analog signal, may have a high dynamic range (HDR). The quantity of charge accumulated in the photodiode PD may refer to the quantity of photocharge generated by the photodiode PD in response to incident light that is received by the photodiode PD during an exposure time. Hereinafter, the terms "quantity of charge" and "quantity of photocharge" may have the same meaning and be used interchangeably with each other. The quantity of charge accumulated in the photodiode PD during the first exposure time ET_1 may be referred to herein as a first quantity of charge, a first photocharge packet, or the like. The quantity of charge accumulated in the photodiode PD during the second exposure time ET_2 may be referred to herein as a second quantity of charge, a second photocharge packet, or the like.

The row driver 120 may drive the pixel array 110. The row driver 120 may decode a row control signal (for example, a row address) received from the timing controller 140 and may select at least one row line RL of the plurality of row lines RL, which are connected to the pixel array 110, in response to the decoded row control signal. Here, the row control signal may select at least one row of a plurality of rows in the pixel array 110.

The row driver 120 may generate pixel control signals provided (e.g., transmitted) to each pixel, for example, a select control signal, a reset control signal, and a transmission control signal, based on the row control signal. The row driver 120 may transmit, to the pixel array 110, control signals for outputting a pixel signal, and the pixel PX may output the pixel signal by operating in response to the control signals.

The ADC circuit 130 may respectively convert pixel signals, which are output from the pixel array 110, into pixel values that are digital signals. The ADC circuit 130 may include a plurality of correlated double sampling (CDS) circuits, and each of the plurality of CDS circuits may convert a pixel signal into a pixel value in a CDS manner. The pixel signal received through each of the plurality of column lines CL may be converted into a pixel value by a CDS circuit corresponding thereto from among the plurality of CDS circuits.

The timing controller 140 may output (e.g., transmit) a control signal to each of the row driver 120, the ADC circuit 130, and the image signal processor 150 and may control operations and operation timings of the row driver 120, the ADC circuit 130, and the image signal processor 150.

The timing controller 140 may control turn-on and turn-off timings of a transmission transistor TX and a reset transistor RX, which are included in the pixel PX, by controlling operations and operation timings of the row driver 120. Referring to FIG. 7, the timing controller 140 may turn on the transmission transistor TX in a first reset period RST_1, a first readout period RD_1, and a second readout period RD_2, and in particular, as the transmission transistor TX is turned on in the first readout period RD_1 and the second readout period RD_2, photocharges accumulated in the photoelectric conversion device (that is, PD) may move to the floating diffusion node FD in response to incident light.

The timing controller 140 may convert an analog signal into a digital signal by controlling operations and operation timings of the ADC circuit 130. For example, the timing controller 140 may generate a first digital signal by performing analog-to-digital conversion on a first analog signal in the first readout period RD_1.

The image sensor 100 may further include a ramp signal generator, and the ramp signal generator may generate a ramp signal (for example, a ramp voltage) that has a level (e.g., signal magnitude, intensity, etc.) increasing or decreasing with a certain slope (e.g., a certain time-rate of change). The ramp signal may be provided to each of a plurality of ADCs in the ADC circuit 130. The timing controller 140 may control operations and operation timings of the ramp signal generator. For example, the ADC circuit 130 may compare the first analog signal with a first ramp signal, and the first digital signal may be generated based thereon. Likewise, the second analog signal may be compared with a second ramp signal, and a second digital signal may be generated based thereon. In addition, the first ramp signal may be different from the second ramp signal in terms of a ramping time and/or a ramping start voltage level. For example, the first ramp signal may be different from the second ramp signal such that at least one of a ramping time of the first ramp signal or a ramping start voltage level of the first ramp signal is different from a corresponding one of a ramping time of the second ramp signal or a ramping start voltage level of the second ramp signal. Restated, for example, the ramping time of the first ramp signal may be different from the ramping time of the second ramp signal, the ramping start voltage level of the first ramp signal may be different from the ramping start voltage level of the second ramp signal, or both of the ramping time and the ramping start voltage level of the first ramp signal may be different from the corresponding, respective ones of the ramping time and the ramping start voltage level of the second ramp signal.

The image signal processor 150 may perform various signal processing on a digital signal, for example, the first digital signal, which is provided by the ADC circuit 130. For example, the image signal processor 150 may generate image data based on the first digital signal and the second digital signal, which are received, and may perform signal processing, such as image quality compensation, binning, or downsizing. For example, first and second digital signals, provided by the ADC based on respective first and second analog signals received from a given pixel PX, may be used by the image signal processor 150 to generate a corresponding pixel value of a corresponding pixel of an HDR image. The image quality compensation may include, for example, signal processing, such as black level compensation, lens shading compensation, crosstalk compensation, or bad pixel correction.

The image data output from the image signal processor 150 may be transmitted to an external processor. For example, the external processor may include a host processor of an electronic device, in which the image sensor 100 is mounted. For example, the external processor may include an application processor of a mobile terminal. The image sensor 100 may transmit the image data to the external processor according to a data communication method that is based on a set interface, for example, Mobile Industry Processor Interface.

Referring to FIG. 1, although the image signal processor 150 is illustrated as being included in the image sensor 100, the inventive concepts are not limited thereto, and the image signal processor 150 may be located outside the image sensor 100.

According to some example embodiments, the first analog signal may include a Lin-Log signal. The Lin-Log signal is described with reference to FIGS. 3A to 6B. Although the Lin-Log signal may be used to obtain an HDR image, when the HDR image is obtained by using the Lin-Log signal, fixed pattern noise may be generated due to a difference in charge capacity between photodiodes PD respectively included in the plurality of pixels PX, and when a scene, in which a relatively dark object compared to the background moves, is captured, gray edge artifacts having no shapes and no colors may be generated around the object in a moving direction of the object in a generated image of the object. To solve such issues, the second analog signal may be used. The aforementioned charge capacity of the photodiode PD may refer to a maximum capacity capable of accumulating photocharges, which are generated in response to incident light, in the photodiode PD.

Figure 2:
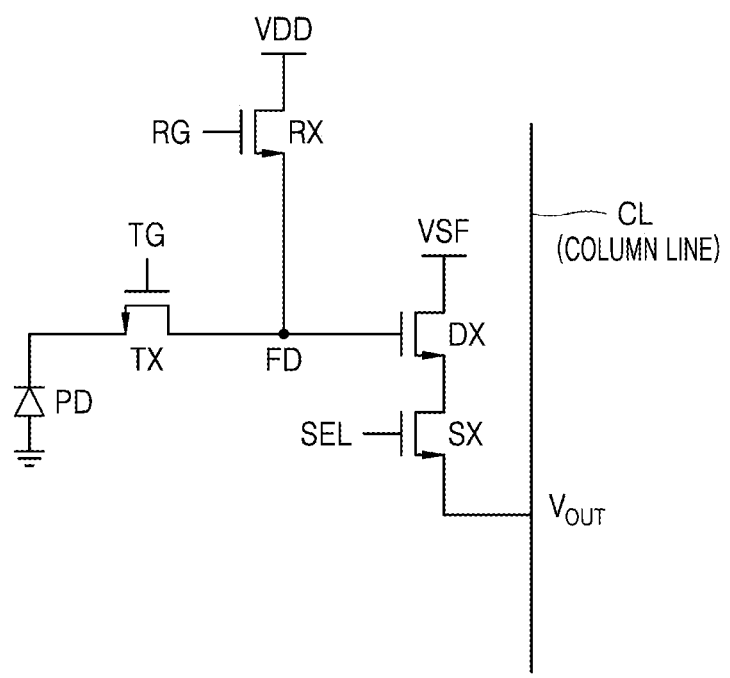
FIG. 2 is a circuit diagram illustrating an implementation example of a pixel according to some example embodiments.

FIG. 2 is a circuit diagram illustrating an implementation example of a pixel according to some example embodiments.

The pixel PX may include the photodiode PD and a plurality of transistors, for example, the transmission transistor TX, the reset transistor RX, a driving transistor DX, and a select transistor SX.

The photodiode PD may convert light, which is incident from outside thereof, into an electrical signal. The photodiode PD generates charges according to the intensity of light. The quantity of charge generated by the photodiode PD varies with an image capture environment (low illuminance or high illuminance). For example, although the quantity of charge generated by the photodiode PD in a high-illuminance environment may reach the charge capacity of the photodiode PD, the quantity of charge generated by the photodiode PD in a low-illuminance environment may not reach the charge capacity of the photodiode PD.

The pixel PX may be exposed to incident light in the high-illuminance environment, and here, when the quantity of charge generated by the photodiode PD reaches the charge capacity of the photodiode PD, an analog signal, which is based on photocharges accumulated in the photodiode PD, may include a Lin-Log signal including both a linear signal and a log signal. The Lin-Log signal including both a linear signal and a log signal is described in detail with reference to FIGS. 3A to 6B.

Each of the transmission transistor TX, the reset transistor RX, the driving transistor DX, and the select transistor SX may operate in response to control signals provided by a peripheral circuit (in particular, the row driver 120 included in the peripheral circuit), for example, a reset control signal RG, a transmission control signal TG, and a select control signal SEL.

The reset transistor RX may be turned on in response to the reset control signal RG applied to a gate terminal thereof to connect a pixel power supply voltage VDD and the floating diffusion node FD to each other and may reset photocharges accumulated in the floating diffusion node FD by the pixel power supply voltage VDD.

The transmission transistor TX may be turned on in response to the transmission control signal TG and thus transmit charges generated by the photodiode PD to the floating diffusion node FD. Depending on a voltage level of the transmission control signal TG (which may be referred to as a turn-on voltage of the transmission transistor TX), the charge capacity of the photodiode PD, and/or the quantity of photocharge accumulated in the photodiode PD, the quantity of photocharge moving from the photodiode PD to the floating diffusion node FD may vary. Specifically, descriptions are made with reference to FIGS. 3A to 5C.

The charges accumulated in the floating diffusion node FD may generate a voltage. In other words, the charges accumulated in the floating diffusion node FD may be converted into a voltage. A voltage corresponding to the voltage of the floating diffusion node FD may be output as a pixel voltage Vout through the select transistor SX. For example, when the quantities of charge accumulated are different from each other, the quantities of charge accumulated may be respectively converted into different pixel voltages.

The select transistor SX may select the pixel PX. The select transistor SX may be turned on in response to the select control signal SEL applied to a gate terminal thereof and thus output the pixel voltage Vout (or current), which is output from the driving transistor DX, to a column line CL. The pixel voltage Vout may be provided to the ADC circuit 130 (see FIG. 1) through the column line CL.

Figure 3A:
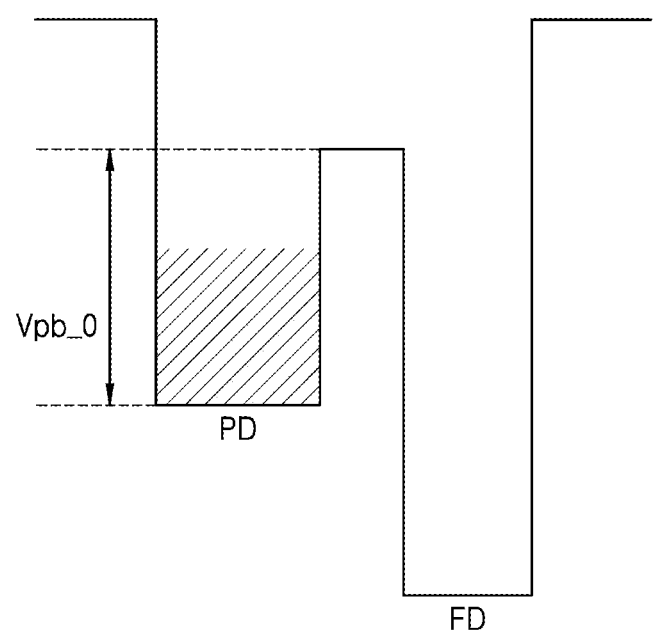
FIGS. 3A, 3B, and 3C each illustrate a potential diagram of a photoelectric conversion device and a floating diffusion node, according to some example embodiments.
Figure 3B:
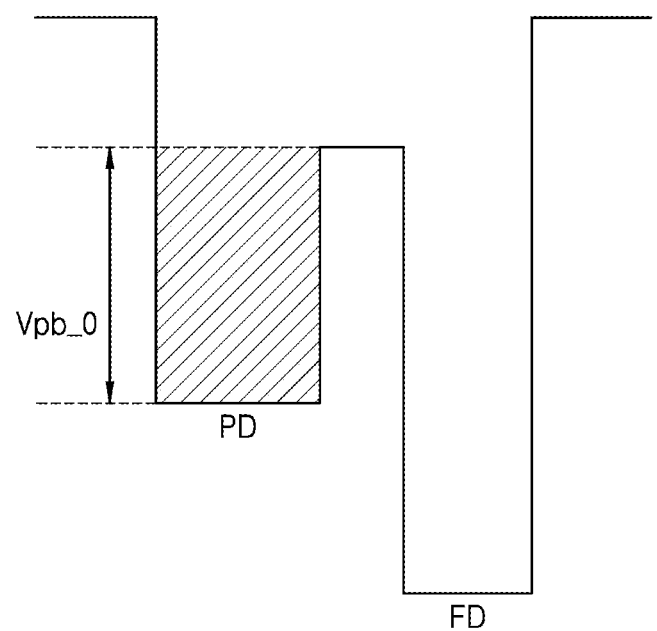
Figure 3C:
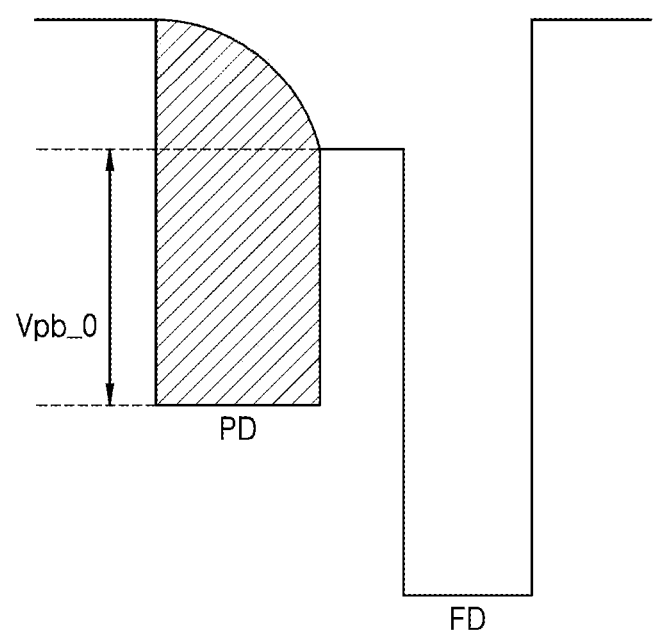

FIGS. 3A, 3B, and 3C each illustrate a potential diagram of a photoelectric conversion device and the floating diffusion node FD, according to some example embodiments.

FIG. 3A illustrates potential levels of the photodiode PD and the floating diffusion node FD and also illustrates the quantity of photocharge (represented by a hatched area) accumulated in the photodiode PD due to incident light. FIG. 3A corresponds to a state before the photodiode PD is saturated. A saturation state of the photodiode PD may refer to a state in which the quantity of charge corresponding to a potential barrier Vpb when the transmission control signal TG is not applied to the transmission transistor TX is accumulated in the photodiode PD. The potential barrier Vpb when the transmission control signal TG is not applied to the transmission transistor TX may be referred to as an intrinsic potential barrier Vpb_0. For example, the saturation state may refer to a state in which the quantity of charge corresponding to the intrinsic potential barrier Vpb_0 is accumulated in the photodiode PD.

When the transmission control signal TG is applied to the transmission transistor TX, the potential barrier Vpb may be lower than the intrinsic potential barrier Vpb_0. Specific examples are described with reference to FIGS. 4A to 5C. Like the state of FIG. 3, a state in which the quantity of charge accumulated in the photodiode PD is less than the quantity of charge corresponding to the intrinsic potential barrier Vpb_0 may be referred to as an unsaturation state.

FIG. 3B illustrates the potential levels of the photodiode PD and the floating diffusion node FD and also illustrates the quantity of photocharge (represented by a hatched area) accumulated in the photodiode PD due to incident light. The quantity of photocharge accumulated in FIG. 3B may be greater than the quantity of photocharge accumulated in FIG. 3A. For example, FIG. 3B may be an example in which the pixel PX is exposed to a higher illuminance environment than that of FIG. 3A, or in which an exposure time of the pixel PX is longer than that of FIG. 3A in the same illuminance environment.

FIG. 3B illustrates a state in which the quantity of photocharge corresponding to the intrinsic potential barrier Vpb_0 is accumulated in the photodiode PD. That is, the photodiode PD of FIG. 3B may be in the saturation state. The quantity of photocharge accumulated in the photodiode PD from a time point at which photocharges begin to be accumulated in the photodiode PD in response to incident light until the saturation state of FIG. 3B may linearly increase.

FIG. 3C illustrates the potential levels of the photodiode PD and the floating diffusion node FD and also illustrates the quantity of photocharge (represented by a hatched area) accumulated in the photodiode PD due to incident light. FIG. 3C may correspond to a state in which photocharges are further accumulated in the photodiode PD than in the saturation state of FIG. 3B. The state of FIG. 3C may be referred to as a supersaturation state.

The quantity of photocharge accumulated in the photodiode PD from the saturation state until the supersaturation state may logarithmically increase. For example, when photocharges are further accumulated in the photodiode PD in the saturation state in response to incident light, although the quantity of photocharge accumulated in the photodiode PD may increase, the quantity of photocharge accumulated in the photodiode PD may increase on a log scale unlike before the saturation state.

In other words, while the quantity of photocharge accumulated in the photodiode PD in response to incident light from a state in which no photocharge is accumulated in the photodiode PD until the saturation state (FIG. 3B) may linearly increase, the quantity of photocharge accumulated in the photodiode PD in response to incident light from the saturation state (FIG. 3B) until the supersaturation state (FIG. 3C) may logarithmically increase.

Figure 4A:
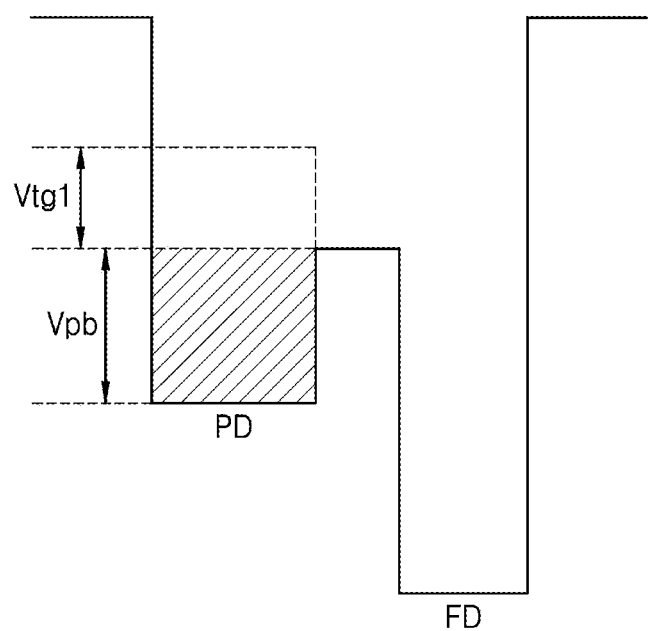
FIGS. 4A, 4B, and 4C each illustrate a potential diagram of a photoelectric conversion device and a floating diffusion node, according to some example embodiments.
Figure 4B:
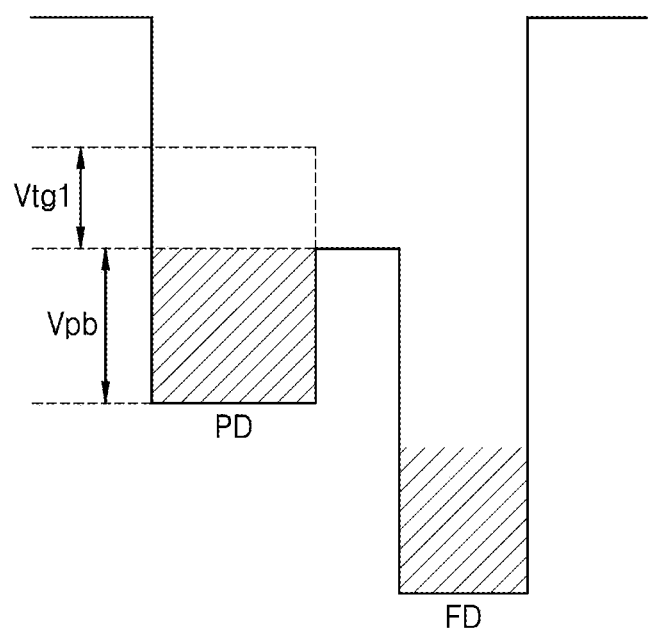
Figure 4C:
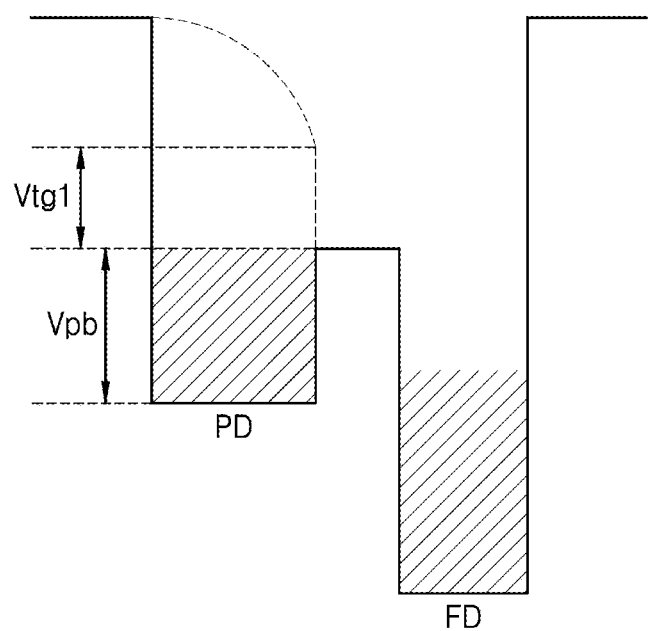

FIGS. 4A, 4B, and 4C each illustrate a potential diagram of a photoelectric conversion device (that is, PD) and the floating diffusion node FD, according to some example embodiments.

FIGS. 4A, 4B, and 4C illustrate that photocharges accumulated in the photodiode PD have moved to the floating diffusion node FD when the transmission control signal TG equally having a first turn-on voltage Vtg1 is applied to the transmission transistor TX in the examples of FIGS. 3A, 3B, and 3C, respectively.

The intrinsic potential barrier Vpb_0 may be reduced by as much as the first turn-on voltage Vtg1. Photocharges having a higher potential level than the reduced potential barrier Vpb may move from the photodiode PD to the floating diffusion node FD. Therefore, referring to FIGS. 4A, 4B, and 4C, the quantity of photocharge moving to the floating diffusion node FD may vary depending on the quantity of photocharge accumulated in the photodiode PD. For example, the quantity of photocharge having moved from the photodiode PD to the floating diffusion node FD may increase in the order of FIG. 4A, FIG. 4B, and FIG. 4C.

Figure 5A:
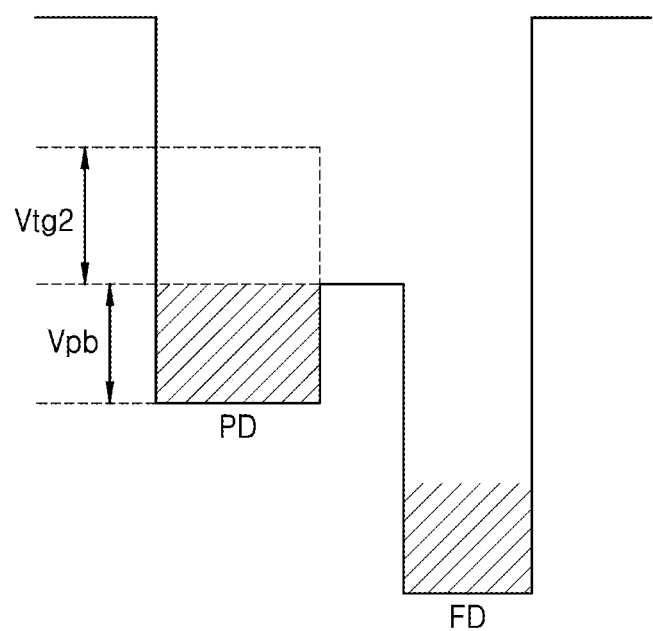
FIGS. 5A, 5B, and 5C each illustrate a potential diagram of a photoelectric conversion device and a floating diffusion node, according to some example embodiments.
Figure 5B:
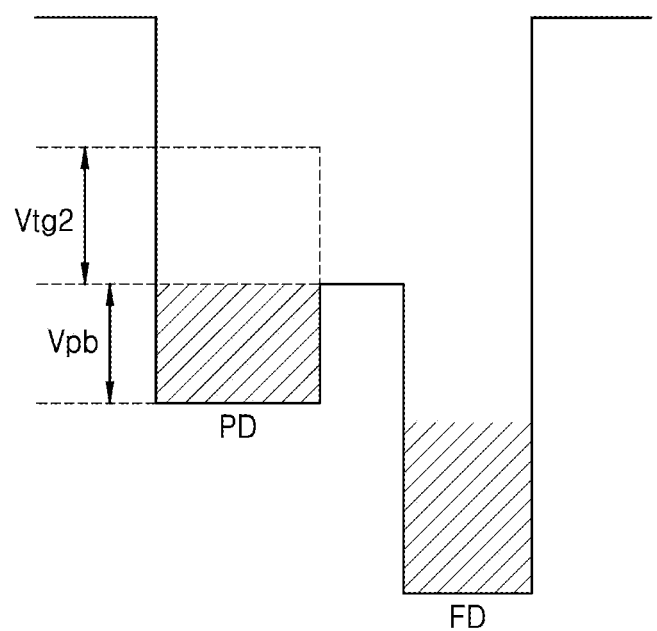
Figure 5C:
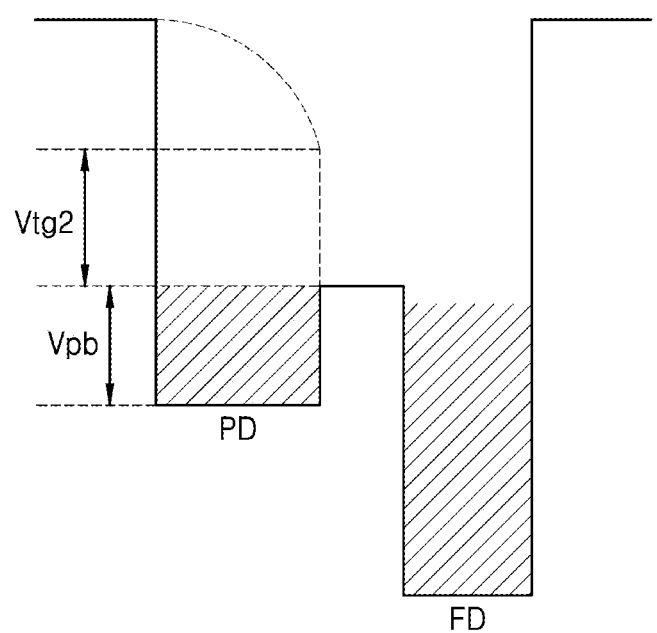

FIGS. 5A, 5B, and 5C each illustrate a potential diagram of a photoelectric conversion device (that is, PD) and the floating diffusion node FD, according to some example embodiments.

FIGS. 5A, 5B, and 5C illustrate that photocharges accumulated in the photodiode PD have moved to the floating diffusion node FD when the transmission control signal TG equally having a second turn-on voltage Vtg2 is applied to the transmission transistor TX in the examples of FIGS. 3A, 3B, and 3C, respectively.

The intrinsic potential barrier Vpb_0 may be reduced by as much as the second turn-on voltage Vtg2. Photocharges having a higher potential level than the reduced potential barrier Vpb may move from the photodiode PD to the floating diffusion node FD. Therefore, referring to FIGS. 5A, 5B, and 5C, the quantity of photocharge moving to the floating diffusion node FD may vary depending on the quantity of photocharge accumulated in the photodiode PD. For example, the quantity of photocharge having moved from the photodiode PD to the floating diffusion node FD may increase in the order of FIG. 5A, FIG. 5B, and FIG. 5C.

The second turn-on voltage Vtg2 may be higher (e.g., greater in magnitude) than the first turn-on voltage Vtg1. Therefore, the potential barrier Vpb when the second turn-on voltage Vtg2 is applied may be lower than the potential barrier Vpb when the first turn-on voltage Vtg1 is applied, and thus, more photocharges may move from the photodiode PD to the floating diffusion node FD. For example, the quantity of photocharge having moved in FIG. 4A may be greater than the quantity of photocharge having moved in FIG. 5A.

FIGS. 3A to 5C may each illustrate a potential diagram for the same photodiode PD. However, the photodiodes PD in the plurality of pixels PX of the pixel array 110 may respectively have different charge capacities. That is, respective potential diagrams of a plurality of photodiodes PD in the pixel array 110 may be different from each other. Due to such differences, fixed pattern noise may be generated. Because the fixed pattern noise is generated due to a difference in charge capacity between the photodiodes PD, the fixed pattern noise may be generated when the photodiodes PD of the pixel array 110 are in the saturation state. Therefore, the fixed pattern noise may more likely be generated in a high-illuminance environment than in a low-illuminance environment. That is, when the photodiodes PD of the pixel array 110 are in the saturation or supersaturation state due to the quantity of charge accumulated, the fixed pattern noise may be generated in an image generated by the image sensor 100.

To prevent the fixed pattern noise, or to reduce or minimize the occurrence and/or magnitude of such fixed pattern noise, a lower voltage than the intrinsic potential barrier Vpb_0 may be applied. For example, the first turn-on voltage Vtg1 or the second turn-on voltage Vtg2, which is described above, may be applied as a voltage of the transmission control signal TG to the transmission transistor TX. When the first turn-on voltage Vtg1 or the second turn-on voltage Vtg2 is applied, only photocharges having a higher potential than the reduced potential barrier Vpb, from among photocharges accumulated in the photodiode PD in the supersaturation state, may move to the floating diffusion node FD. Because some photocharges moving at this moment are irrelevant to the charge capacity of each of the plurality of photodiodes PD, the fixed pattern noise, which may be generated in the supersaturation state, may be prevented, or reduced or minimized in occurrence and/or magnitude, such that the image sensor 100 implementing a method according to any of the example embodiments may exhibit improved performance based on generating HDR images (e.g., HDR images of dark objects against a bright background) having fewer, minimized, or no fixed pattern noise and thus generating HDR images having improved quality.

Figure 6A:
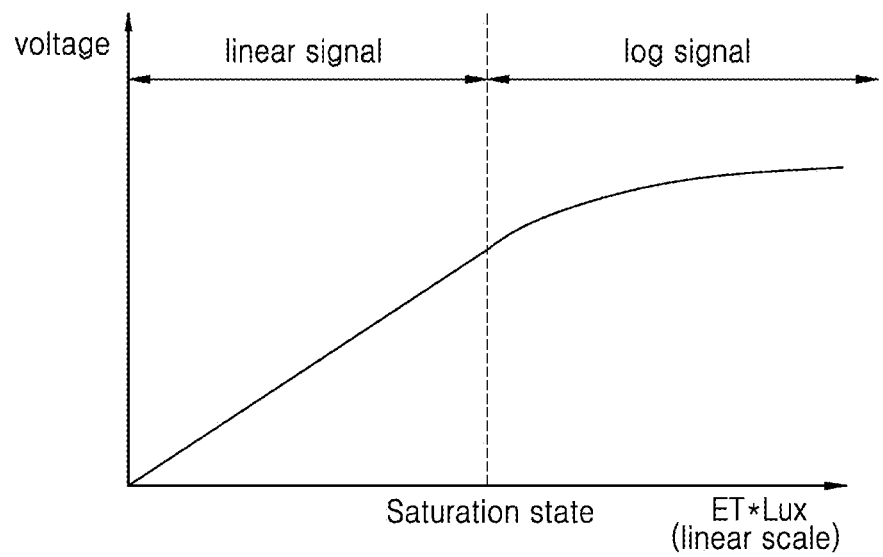
FIGS. 6A and 6B each illustrate an analog signal including a linear signal and a log signal.
Figure 6B:
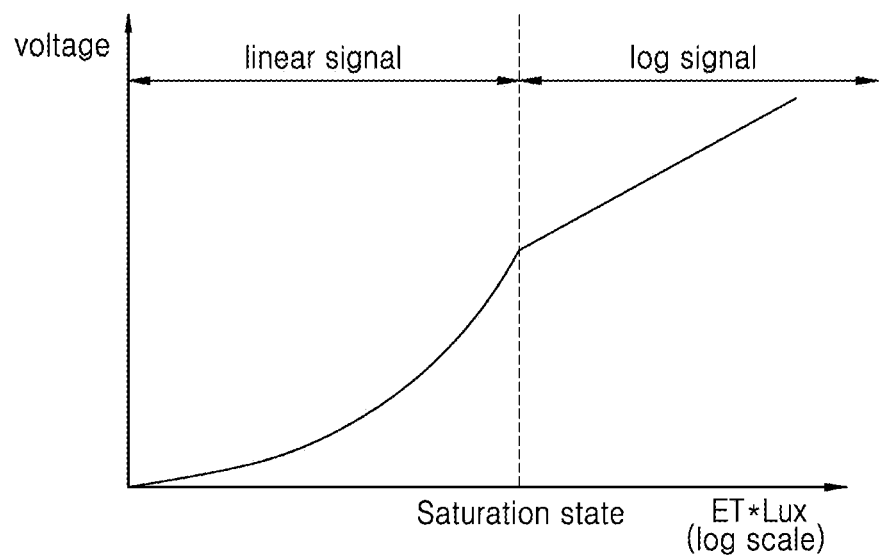

FIGS. 6A and 6B each illustrate an analog signal including a linear signal and a log signal.

As described above, photocharges accumulated in the photodiode PD in response to incident light may linearly increase until the photodiode PD is in the saturation state, and may logarithmically increase after the saturation state of the photodiode PD. In addition, because an analog signal (pixel voltage Vout) is generated based on the accumulated photocharges, the analog signal may include both a linear signal and a log signal.

FIGS. 6A and 6B each illustrate the analog signal based on the quantity of charge accumulated in the photodiode. In FIGS. 6A and 6B, the horizontal axis represents a value obtained by multiplying an exposure time ET by illuminance Lux, and the vertical axis represents a voltage based on the quantity of charge accumulated in the photodiode PD.

Referring to FIG. 6A, photocharges may be generated in response to incident light, and thus, the quantity of charge accumulated in the photodiode PD may linearly increase until the saturation state of the photodiode PD and may logarithmically increase after the saturation state of the photodiode PD. Therefore, an analog signal based on the quantity of charge accumulated in the photodiode PD may have a linear signal before the saturation state and have a log signal after the saturation state.

In FIG. 6B, the horizontal axis represents, on a log scale, a value obtained by multiplying the exposure time ET by the illuminance Lux, and the vertical axis represents a voltage based on the quantity of charge accumulated in the photodiode PD. Because the horizontal axis in FIG. 6B is on a log scale, the linear signal before the saturation state may exponentially increase, and the log signal after the saturation state may linearly increase.

When the quantity of charge accumulated in the photodiode PD corresponds to the supersaturation state, the analog signal based on the quantity of charge accumulated may include a Lin-Log signal including a linear signal and a log signal. When image data is generated by using the Lin-Log signal, an HDR image may be obtained by reading the horizontal axis for a dark region on a linear scale as in FIG. 6A and reading the horizontal axis for a bright region on a log scale as in FIG. 6B. However, when the HDR image is obtained by using the Lin-Log signal, gray edge artifacts may be generated. The gray edge artifacts refer to noise in which, when a relatively dark object moves against a bright background, the color and shape around the dark object in a moving direction of the dark object are shown as gray. For example, when an HDR image of the dark object moving in a certain direction against the bright background is obtained by using the Lin-Log signal, the photodiode PD for the bright background may be in the supersaturation state, and the photodiode PD for the dark object may be in the unsaturation state. Here, the dark object moves during a capture time and thus may block the bright background in the moving direction of the dark object, and because the photodiode PD corresponding to the bright background has been in the supersaturation state, it may be difficult to obtain an intended image corresponding to the dark object.

FIG. 7 illustrates a timing diagram of a pixel of an image sensor, according to some example embodiments.

Specifically, FIG. 7 is a timing diagram for the transmission control signal TG, the reset control signal RG, and the select control signal SEL respectively applied to the transmission transistor TX, the reset transistor RX, and the select transistor SX, which are included in the pixel PX.

Each of the transmission control signal TG, the reset control signal RG, and the select control signal SEL may be at an active level, for example, logic high, and when each of transmission control signal TG, the reset control signal RG, and the select control signal SEL is at the active level, each of the transmission transistor TX, the reset transistor RX, and the select transistor SX may be turned on. For example, contrary to the example described above, each of the transmission control signal TG, the reset control signal RG, and the select control signal SEL may be at an inactive level, for example, logic low, and when each of transmission control signal TG, the reset control signal RG, and the select control signal SEL is at the inactive level, each of the transmission transistor TX, the reset transistor RX, and the select transistor SX may be turned off.

The numbers in the terms and reference numerals "first transmission control signal TG_1", "second transmission control signal TG_2", and "third transmission control signal TG_3" shown in FIG. 7 represent sequences of applying the respective transmission control signals (that is, TG_1, TG_2, and TG_3). The respective transmission control signals (that is, TG_1, TG_2, and TG_3) are distinguished from each other by adding the numbers for convenience of description, and time for maintaining the active level and/or the turn-on voltage Vtg may be the same, but the inventive concepts are not limited thereto.

In a first reset period RST_1, the third transmission control signal TG_3 and the reset control signal RG may be at the active level, and the select control signal SEL may be at the inactive level. Because the third transmission control signal TG_3 and the reset control signal RG are at the active level, the transmission transistor TX and the reset transistor RX may be turned on. Because the transmission transistor TX and the reset transistor RX are turned on, the pixel power supply voltage VDD may be applied to the photodiode PD and the floating diffusion node FD, and photocharges remaining in the photodiode PD and the floating diffusion node FD may be removed by the pixel power supply voltage VDD, whereby the photodiode PD and the floating diffusion node FD before a first exposure time ET_1 may be reset.

The pixel PX may be exposed to incident light from a time point at which the third transmission control signal TG_3 transits from the active level to the inactive level until a time point at which the first transmission control signal TG_1 transits from the inactive level to the active level, and the exposure time set forth above may be referred to as the first exposure time ET_1. Because the transmission control signal TG is at the inactive level during the first exposure time ET_1, the transmission transistor TX is turned off. Therefore, photocharges accumulated in the photodiode PD in response to incident light that is incident during the first exposure time ET_1 may not be able to move to the floating diffusion node FD and may accumulate in the photodiode PD. For example, photocharges may accumulate in the photodiode PD in response to incident light that is incident during the first exposure time ET_1 in a high-illuminance environment, and the quantity of photocharge accumulated may correspond to the saturation state or the supersaturation state.

In the first readout period RD_1, the reset control signal RG may be at the inactive level, and the first transmission control signal TG_1 and the select control signal SEL may be at the active level. In the first readout period RD_1, because the reset control signal RG is at the inactive level, the floating diffusion node FD may be cut off from the pixel power supply voltage VDD. The transmission transistor TX may be turned on in response to the first transmission control signal TG_1, and photocharge accumulated in the photodiode PD may move to the floating diffusion node FD due to the turn-on of the transmission transistor TX, whereby photocharges may accumulate in the floating diffusion node FD. The select transistor SX may be turned on in response to the select control signal SEL, and a first pixel voltage Vout_1 based on the photocharge accumulated in the floating diffusion node FD may be read by the ADC circuit 130 (see FIG. 1). For example, the quantity of photocharge accumulated in the photodiode PD during the first exposure time ET_1 may be equal to or greater than that corresponding to the saturation state, and the first analog signal may be generated based on the photocharges accumulated during the first exposure time ET_1 and may include a linear signal and a log signal. That is, the first analog signal may include a Lin-Log signal.

After the first readout period RD_1, the reset control signal RG may be activated to turn on the reset transistor RX, and the floating diffusion node FD may be connected to the pixel power supply voltage VDD. Therefore, the photocharges generated during the first exposure time ET_1 and then accumulated in the floating diffusion node FD may be removed from the floating diffusion node FD by the pixel power supply voltage VDD. That is, the floating diffusion node FD may be reset as the reset transistor RX is turned on.

The pixel PX may be exposed to incident light from a time point at which the first transmission control signal TG_1 transits from the active level to the inactive level until a time point at which the second transmission control signal TG_1 transits from the inactive level to the active level, and the exposure time set forth above may be referred to as a second exposure time ET_2. Because the transmission control signal TG is at the inactive level during the second exposure time ET_2, the transmission transistor TX is turned off. Photocharges generated in the photodiode PD in response to incident light that is incident during the second exposure time ET_2 may not be able to move to the floating diffusion node FD and may accumulate in the photodiode PD. For example, photocharges may accumulate in the photodiode PD in response to incident light that is incident during the second exposure time ET_2 in a low-illuminance environment, and the quantity of photocharge accumulated may correspond to the unsaturation state.

In the second readout period RD_2, the reset control signal RG may be at the inactive level, and the second transmission control signal TG_2 and the select control signal SEL may be at the active level. In the second readout period RD_2, because the reset control signal RG is at the inactive level, the floating diffusion node FD may be cut off from the pixel power supply voltage VDD. The transmission transistor TX may be turned on in response to the second transmission control signal TG_2, and the photocharges accumulated in the photodiode PD during the second exposure time ET_2 may move to the floating diffusion node FD due to the turn-on of the transmission transistor TX, whereby the photocharges may accumulate in the floating diffusion node FD. The select transistor SX may be turned on in response to the select control signal SEL, and a second pixel voltage Vout_2 based on the photocharges accumulated in the floating diffusion node FD may be read by the ADC circuit 130 (see FIG. 1). That is, the second analog signal based on the photocharges accumulated during the second exposure time ET_2 may be generated, and the second analog signal may include a linear signal. For example, the second analog signal may include only a linear signal and may not include any log signal.

After the second readout period RD_2, the reset control signal RG may be activated to turn on the reset transistor RX, and the floating diffusion node FD may be connected to the pixel power supply voltage VDD due to the turn-on of the reset transistor RX. Therefore, the photocharges generated during the second exposure time ET_2 may be removed from the floating diffusion node FD by the pixel power supply voltage VDD. That is, the floating diffusion node FD may be reset as the reset transistor RX is turned on.

By generating one piece of image data based on the first analog signal and the second analog signal, an HDR image may be obtained by using a Lin-Log signal, and gray edge artifacts may be prevented, or the occurrence of such gray edge artifacts in the HDR image generated by the image sensor 100 may be reduced or minimized, such that the image sensor 100 implementing a method according to any of the example embodiments may exhibit improved performance based on generating HDR images (e.g., HDR images of dark objects against a bright background) having fewer, minimized, or no gray artifacts and thus generating HDR images having improved quality. The first analog signal may be generated based on the quantity of charge corresponding to the supersaturation state (e.g., a first quantity of charge accumulated at the pixel PX, for example at the photodiode PD) and may include a Lin-Log signal. The second analog signal may be generated based on the quantity of charge corresponding to the unsaturation state (e.g., a second quantity of charge accumulated at the pixel PX, for example at the photodiode PD) and may include a linear signal. For example, the second analog signal may include only a linear signal and may not include any log signal. As described above, when image data is generated by using the first analog signal (Lin-Log signal), gray edge artifacts may be generated.

Referring to the examples of FIGS. 6A and 6B, the pixel PX may capture the same region in a frame, and the region captured by the pixel PX may change from the bright background to the dark object as the dark object moves. Therefore, the pixel PX may generate the first analog signal for the bright background (high illuminance), based on the quantity of charge accumulated during the first exposure time ET_1 (e.g., the first quantity of charge), and may generate the second analog signal for the dark object (low illuminance), based on the quantity of charge accumulated during the second exposure time ET_2 (e.g., the second quantity of charge). Therefore, the first analog signal may include a Lin-Log signal including a linear signal and a log signal, and the second analog signal may include a linear signal. For example, the second analog signal may include only a linear signal and may not include any log signal. When an HDR image is generated by using the first analog signal, gray edge artifacts may be generated around the dark object in a moving direction of the dark object. Because the second analog signal includes information about the dark object, the occurrence of gray edge artifacts in the HDR image may be prevented, or reduced or minimized, by using the second analog signal (e.g., in combination with the first analog signal).

FIG. 8 illustrates a timing diagram of a pixel of an image sensor, according to some example embodiments.

Specifically, FIG. 8 is a timing diagram for the transmission control signal TG, the reset control signal RG, and the select control signal SEL respectively applied to the transmission transistor TX, the reset transistor RX, and the select transistor SX, which are included in the pixel PX. Repeated descriptions given above regarding FIG. 7 may be omitted.

The timing diagram of FIG. 8 may include a fourth transmission control signal TG_4, as compared with the timing diagram of FIG. 7. In a second reset period RST_2, the fourth transmission control signal TG_4 and the reset control signal RG may be at the active level, and the select control signal SEL may be at the inactive level.

As described above with reference to FIG. 7, after the first readout period RD_1, even when the fourth transmission control signal TG_4 is not applied, the photocharges accumulated in the floating diffusion node FD may be removed by the pixel power supply voltage VDD, and thus, the floating diffusion node FD may be reset. However, when all the photocharges accumulated during the first exposure time ET_1 do not move to the floating diffusion node FD by the first transmission control signal TG_1 and some of the photocharges remain in the photodiode PD, after the first readout period RD_1, even when the reset transistor RX is turned on in response to the activation of the reset control signal RG, because the photodiode PD is not connected to the pixel power supply voltage VDD unlike the floating diffusion node FD, the photocharges remaining in the photodiode PD may not be removed. When the photocharges remain in the photodiode PD, the quantity of photocharge accumulated in the photodiode PD in response to the second exposure time ET_2 may be affected, and thus, an intended image may not be obtained. Therefore, after the first readout period RD_1, by connecting the pixel power supply voltage VDD, the floating diffusion node FD, and the photodiode PD to each other by applying the fourth transmission control signal TG_4, some photocharges, which may remain in the photodiode PD, from among the photocharges accumulated in the photodiode PD during the first exposure time ET_1 may be removed.

Figure 9:
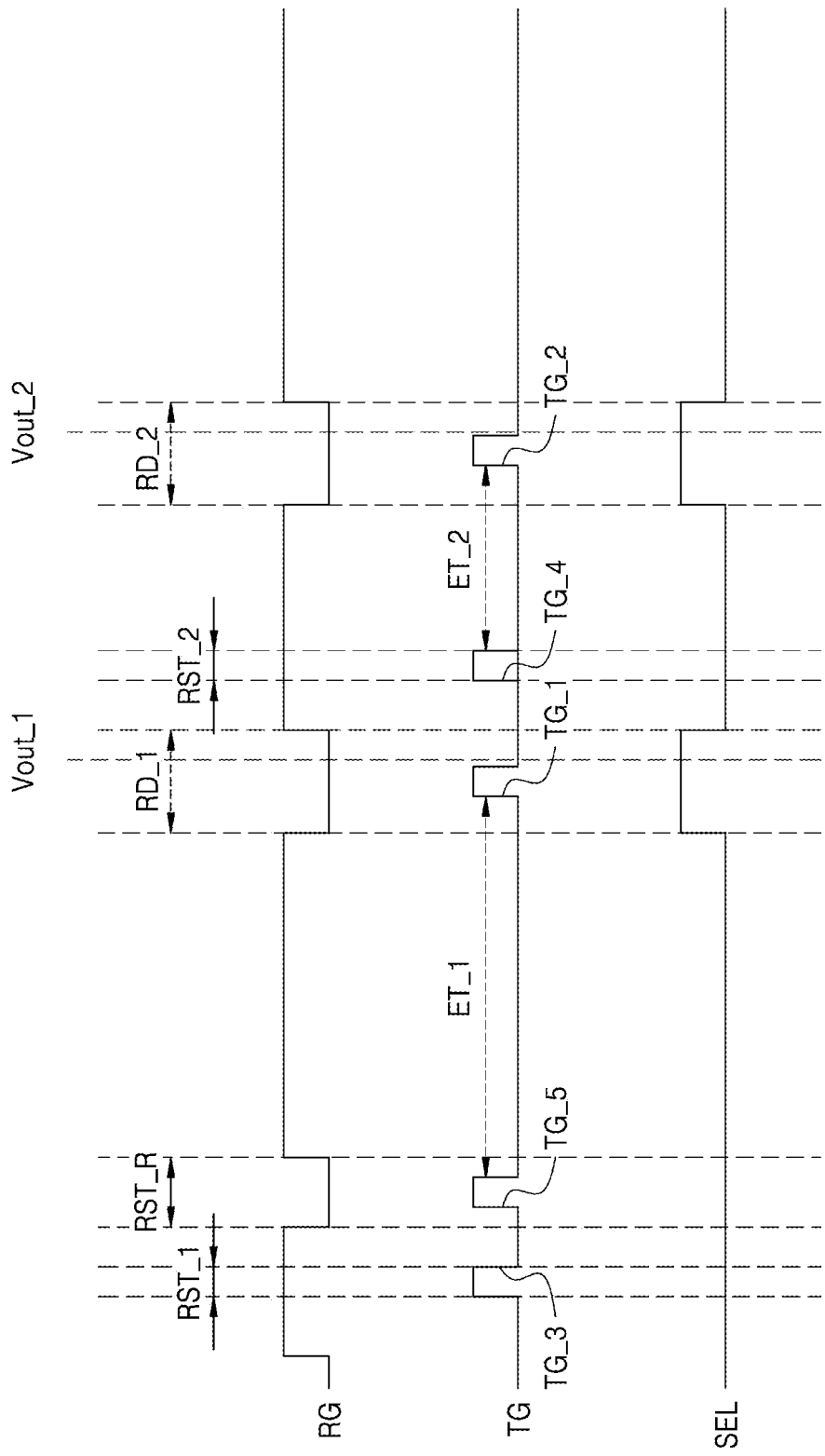
FIG. 9 illustrates a timing diagram of a pixel of an image sensor, according to some example embodiments.

FIG. 9 illustrates a timing diagram of a pixel of an image sensor, according to some example embodiments.

Specifically, FIG. 9 is a timing diagram for the transmission control signal TG, the reset control signal RG, and the select control signal SEL respectively applied to the transmission transistor TX, the reset transistor RX, and the select transistor SX, which are included in the pixel PX. Repeated descriptions given above regarding FIGS. 7 and 8 may be omitted.

The timing diagram of FIG. 9 may include a fifth transmission control signal TG_5, as compared with the timing diagram of FIG. 8. In a remaining reset period RST_R, the fifth transmission control signal TG_5 may be at the active level, and the reset control signal RG and the select control signal SEL may be at the inactive level.

As described above with reference to FIG. 7, in the first reset period RST_1, the third transmission control signal TG_3 and the reset control signal RG may be at the active level, and the select control signal SEL may be at the inactive level. Therefore, the pixel power supply voltage VDD may be applied to the photodiode PD and the floating diffusion node FD, and photocharges remaining in the photodiode PD and the floating diffusion node FD may be removed by the pixel power supply voltage VDD, whereby the photodiode PD and the floating diffusion node FD may be reset before the first exposure time ET_1.

Unlike in the first reset period RST_1, the reset control signal RG may be at the inactive level in the remaining reset period RST_R. When the reset control signal RG is at the active level, the floating diffusion node FD may be connected to the pixel power supply voltage VDD, and even when the transmission control signal TG is activated, a voltage of the floating diffusion node FD may be the pixel power supply voltage VDD. On the other hand, when the reset control signal RG is at the inactive level, the floating diffusion node FD may be cut off from the pixel power supply voltage VDD, and when the transmission control signal TG is activated, the voltage of the floating diffusion node FD may be influenced by the transmission control signal TG. Due to the influence set forth above, photocharges not removed from the photodiode PD through the first reset period RST_1 may be removed through the remaining reset period RST_R. Therefore, when there are photocharges not removed through the first reset period RST_1, by removing the photocharges from the photodiode PD before the first exposure time ET_1, the first analog signal may be generated based on only the photocharges generated during the first exposure time ET_1.

Figure 10:
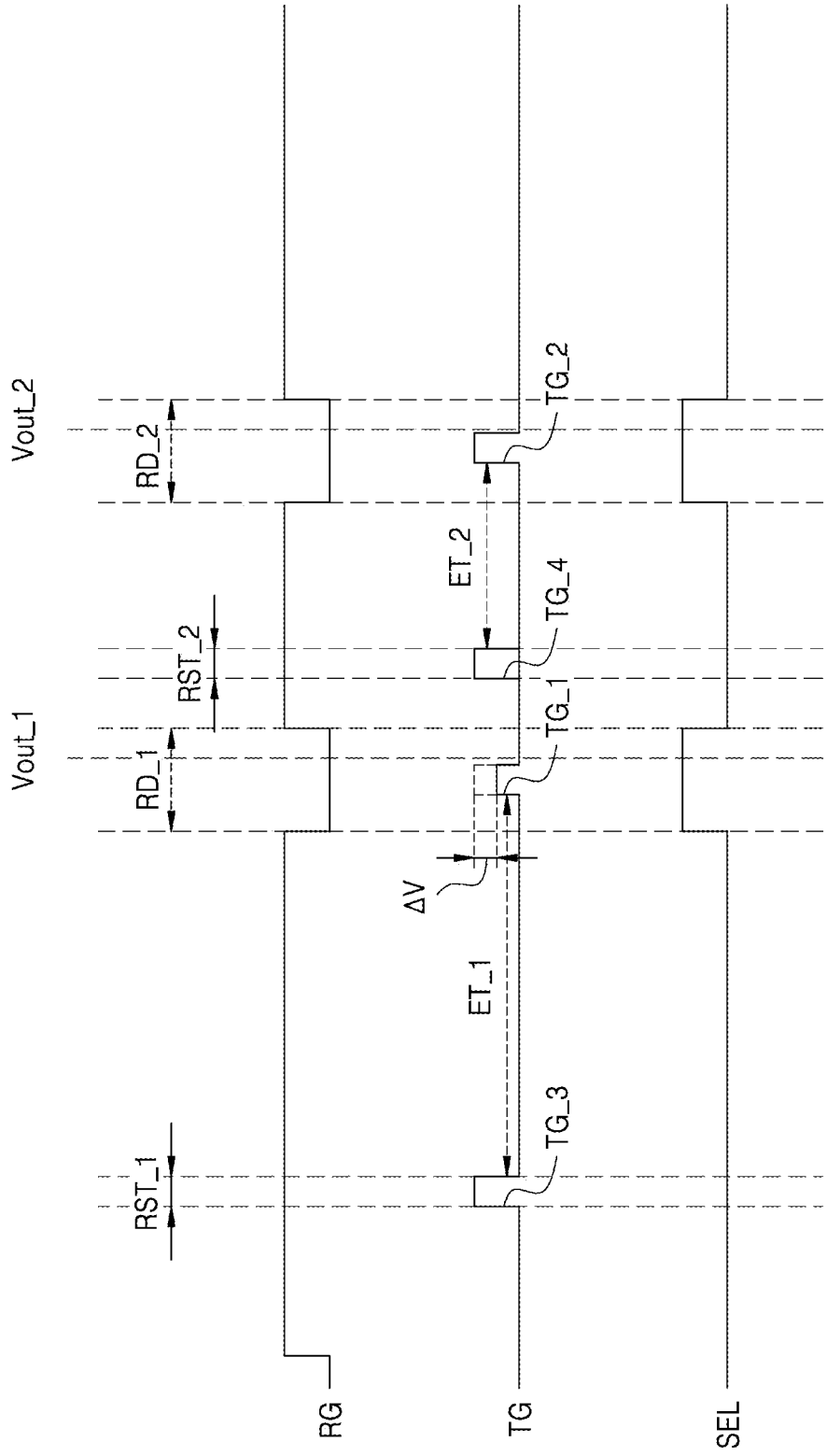
FIG. 10 illustrates a timing diagram of a pixel of an image sensor, according to some example embodiments.

FIG. 10 illustrates a timing diagram of a pixel of an image sensor, according to some example embodiments.

Specifically, FIG. 10 is a timing diagram for the transmission control signal TG, the reset control signal RG, and the select control signal SEL respectively applied to the transmission transistor TX, the reset transistor RX, and the select transistor SX, which are included in the pixel PX. Repeated descriptions given above regarding FIGS. 7, 8, and 9 may be omitted, and descriptions may be made with reference to the descriptions given with reference to FIGS. 3A to 5C.

As compared with the timing diagram of FIG. 8, the first transmission control signal TG_1 in the timing diagram of FIG. 10 may have a lower voltage level (the turn-on voltage Vtg of the transmission transistor TX) than the first transmission control signal TG_1 in the timing diagram of FIG. 8. A difference in the turn-on voltage Vtg between the first transmission control signal TG_1 of FIG. 8 and the first transmission control signal TG_1 of FIG. 10 may be ΔV. Referring to FIG. 10, a first voltage level of the first transmission control signal TG_1 may be lower than a second voltage level of the second transmission control signal TG_2. For example, a first voltage level (e.g., voltage magnitude) of the first transmission control signal TG_1 may be lower than a second voltage level (e.g., voltage magnitude) of the second transmission control signal TG_2 according to the difference be ΔV in the turn-on voltage Vtg between the first transmission control signal TG_1 of FIG. 8, which may be the same as the turn-on voltage Vtg of the second transmission control signal TG_2 of FIGS. 8 and 10, and the first transmission control signal TG_1 of FIG. 10. Therefore, the potential barrier Vpb may be lower when the second transmission control signal TG_2 is applied to the transmission transistor TX than when the first transmission control signal TG_1 is applied to the transmission transistor TX.

As described above with reference to FIGS. 3A to 5C, when the first turn-on voltage Vtg1 of the first transmission control signal TG_1 is applied to the transmission transistor TX, the potential barrier Vpb may be reduced by as much as the first turn-on voltage Vtg1. Therefore, only some photocharges out of photocharges having a higher potential than the reduced potential barrier Vpb may move from the photodiode PD to the floating diffusion node FD. For example, the first analog signal may include a Lin-Log signal, and referring to the descriptions given with reference to FIGS. 5A to 5C, a turn-on voltage that is lower than the intrinsic potential barrier Vpb_0 may be applied to the transmission transistor TX by the transmission control signal TG, thereby preventing, reducing, or minimizing the fixed pattern noise due to a difference in charge capacity between the plurality of photodiodes PD.

Figure 11:
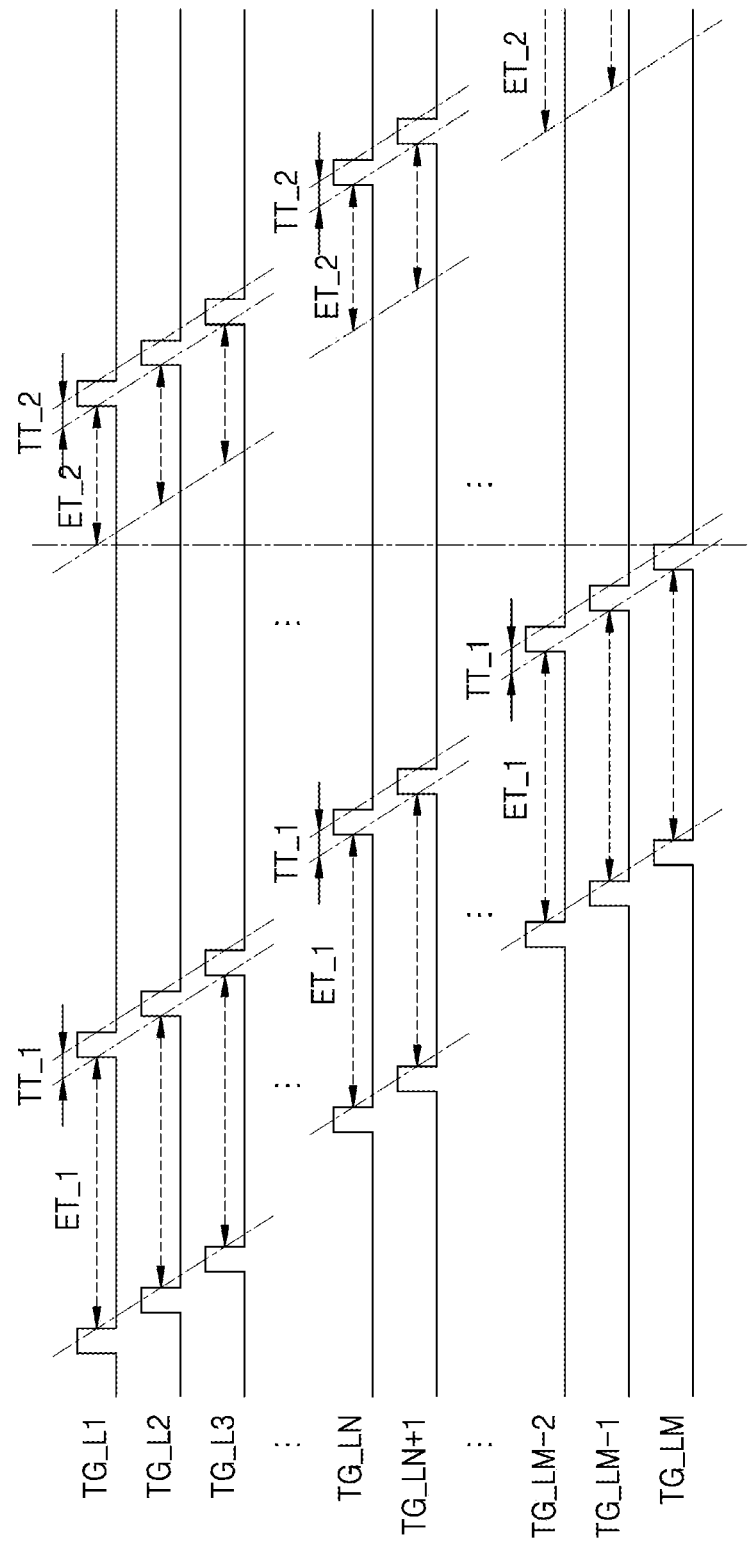
FIGS. 11 and 12 each illustrate a method, performed by an image sensor, of generating an image, according to some example embodiments.
Figure 12:
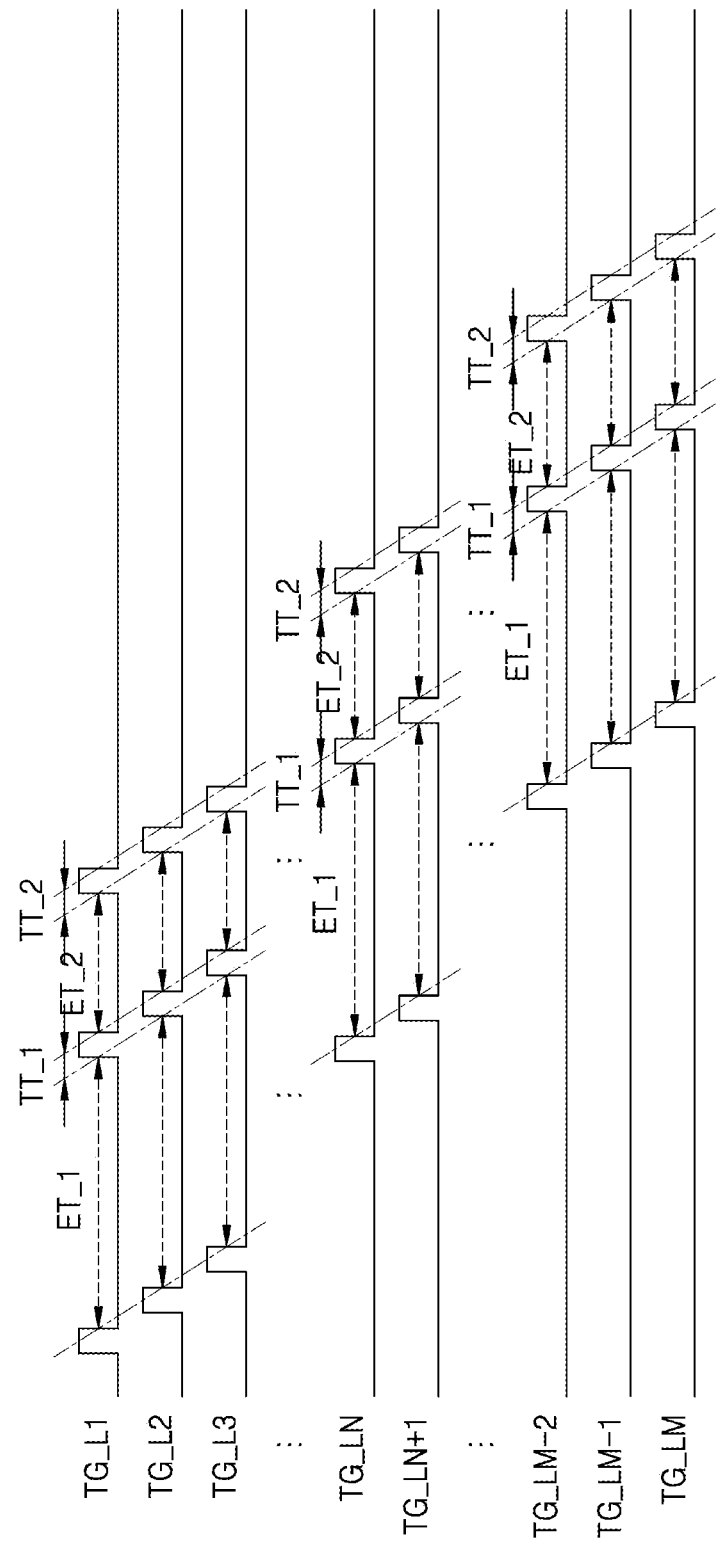

FIGS. 11 and 12 each illustrate a method, performed by an image sensor, of generating an image, according to some example embodiments.

In the graph shown in each of FIGS. 11 and 12, the horizontal axis represents time, and the vertical axis represents a plurality of transmission control signals TG_L1 to TG_LM respectively applied to transmission transistors TX of M row lines RL (where M is an integer equal to or greater than 2) of the pixel array 110 (FIG. 1).

From a first row line RL up to an M-th row line RL of the pixel array 110, the photodiode PD of each of the M row lines RL may generate and accumulate photocharges in response to incident light during the first exposure time ET_1. The photocharges generated by the photodiode PD of each of the M row lines RL during the first exposure time ET_1 may move to the floating diffusion node FD as each of the plurality of transmission control signals TG_L1 to TG_LM is activated during a first transmission time TT_1, and the first analog signal may be generated based on the photocharges having moved to the floating diffusion node FD.

From the first row line RL up to the M-th row line RL of the pixel array 110, the photodiode PD of each of the M row lines RL may generate and accumulate photocharges in response to incident light during the second exposure time ET_2, after the first transmission time TT_1. The photocharges generated by the photodiode PD of each of the M row lines RL during the second exposure time ET_2 may move to the floating diffusion node FD as each of the plurality of transmission control signals TG_L1 to TG_LM is activated during a second transmission time TT_2, and the second analog signal may be generated based on the photocharges having moved to the floating diffusion node FD.

As described above, the first analog signal is generated based on the photocharges accumulated during the first exposure time ET_1, and the second analog signal is generated based on the photocharges accumulated during the second exposure time ET_2. The ADC circuit 130 (see FIG. 1) may generate the first digital signal and the second digital signal, respectively based on the first analog signal and the second analog signal, and one piece of image data may be generated based on the first digital signal and the second digital signal, which are generated.

Referring to FIG. 11, after the end of the first transmission time TT_1 of the M-th row line RL, the second exposure time ET_2 of the first row line RL may begin. Therefore, after M first analog signals are respectively generated from the M row lines RL, the second exposure time ET_2 may begin, and the second analog signal may be generated in response to the second exposure time ET_2. A method of generating image data based on the first analog signal and the second analog signal, which are generated in the manner shown in FIG. 11, may be referred to as a multi-frame method.

Referring to FIG. 12, unlike in FIG. 11, before the end of the first transmission time TT_1 of the M-th row line RL, the second exposure time ET_2 of the first row line RL may begin. Therefore, before the first analog signal of the M-th row line RL is generated, a plurality of row lines RL other than the M-th row line RL may respectively generate second analog signals based on the second exposure time ET_2. A method of generating image data based on the first analog signal and the second analog signal, which are generated in the manner shown in FIG. 12, may be referred to as a staggered method.

According to some example embodiments, the photodiode PD may be in the supersaturation state due to photocharges generated during the first exposure time ET_1, and the first analog signal based on the photocharges generated during the first exposure time ET_1 may include a Lin-Log signal including a linear signal and a log signal. The second exposure time ET_2 may be shorter than the first exposure time ET_1, and the second analog signal based on photocharges generated during the second exposure time ET_2 may include a linear signal. For example, the second analog signal may include only a linear signal and/or may exclude any log signals. Image data may be generated by the multi-frame method or the staggered method, based on the first analog signal and the second analog signal. There may be no gray edge artifacts, reduced gray artifacts, or minimized gray artifacts in the image data generated based on the first analog signal and the second analog signal, such that the image sensor 100 implementing a method according to any of the example embodiments may exhibit improved performance based on generating HDR images (e.g., HDR images of dark objects against a bright background) having fewer, minimized, or no gray artifacts and thus generating HDR images having improved quality.

Figure 13A:
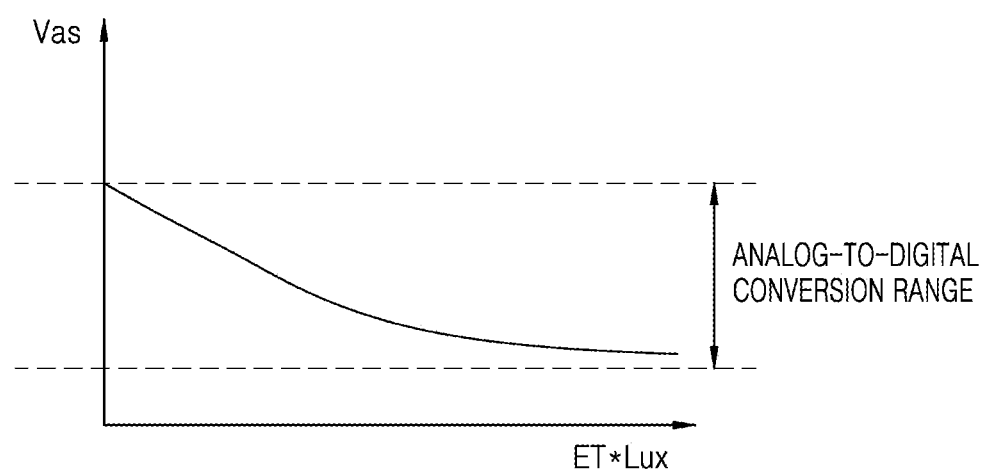
FIGS. 13A, 13B, and 13C each illustrate an analog-to-digital conversion range of an image sensor, according to some example embodiments.
Figure 13B:
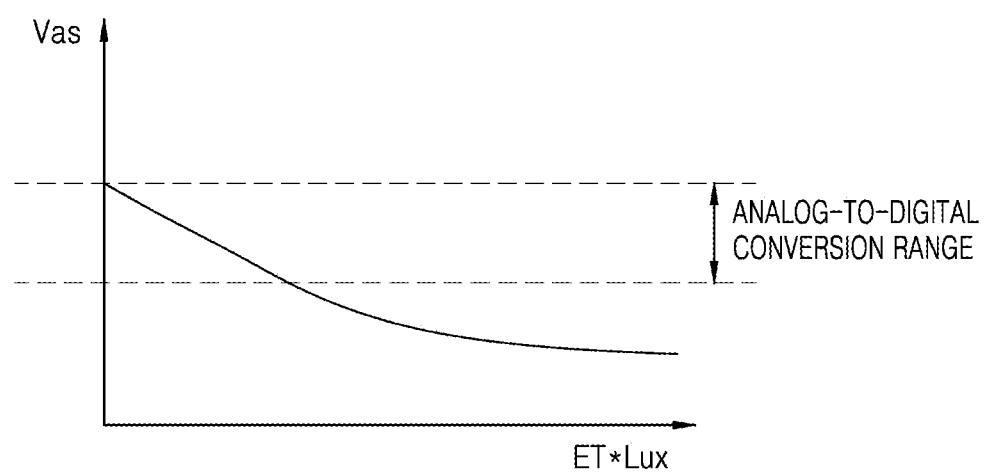
Figure 13C:
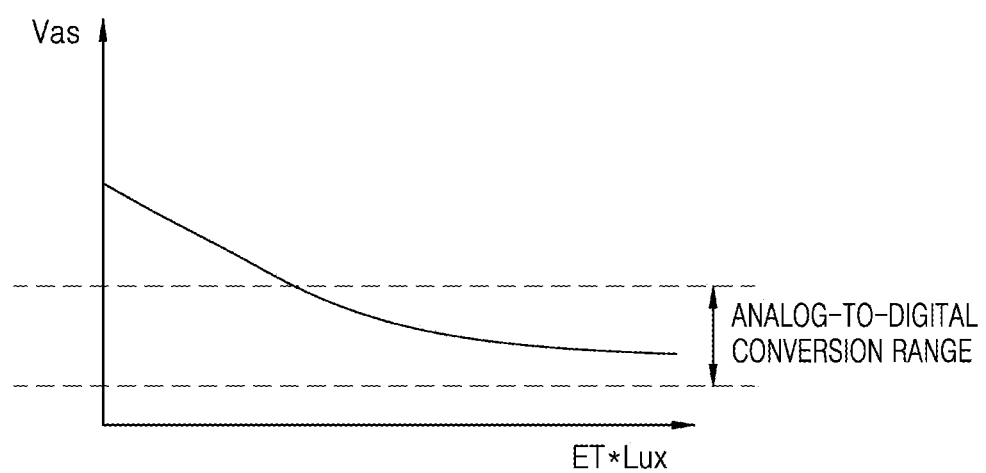

FIGS. 13A, 13B, and 13C each illustrate an analog-to-digital conversion range of an image sensor, according to some example embodiments.

The horizontal axis of the graph shown in each of FIGS. 13A, 13B, and 13C represents a value obtained by multiplying an exposure time by illuminance. The vertical axis of the graph may represent a voltage of an analog signal that is input to the ADC circuit 130, based on photocharges accumulated in the photodiode PD.

The ADC circuit 130 of FIG. 1 may include a plurality of CDS circuits and may receive an analog signal and a ramp signal. The CDS circuit in the ADC circuit 130 may compare the analog signal with the ramp signal and may output a comparison signal transiting from a first level (for example, logic high) to a second level (for example, logic low), when a level of the ramp signal is equal to a level of the analog signal. A time point at which the level of the comparison signal transits may be determined according to a voltage level of the analog signal or a voltage level of the ramp signal. A digital signal may be generated based on the comparison signal.

The ramp signal may have a falling slope, a ramping time, a ramping start voltage level, and/or a ramping end voltage level, and an analog-to-digital conversion range may be differently set by adjusting the ramping time, the ramping start voltage level, or the like of the ramp signal. By differently setting the analog-to-digital conversion range for the same analog signal, a digital signal having a different value may be produced.

The analog signal of each of FIGS. 13A, 13B, and 13C may include a Lin-Log signal.

The analog-to-digital conversion range of FIG. 13A may be a range including both a linear signal and a log signal of the analog signal. For example, the voltage level of the analog signal may decrease earlier than a voltage level of a first ramp signal, and the voltage level of the analog signal, which becomes equal to the voltage level of the first ramp signal, may be a voltage level corresponding to the log signal of the analog signal. Therefore, both the linear signal and the log signal of the analog signal may undergo analog-to-digital conversion.

The analog-to-digital conversion range of FIG. 13B may be a range including only the linear signal (e.g., excluding the log signal). For example, when performing analog-to-digital conversion on the same analog signal as in FIG. 13A, the analog signal may be compared with a second ramp signal, which has the same slope as the first ramp signal but is earlier in a falling point than the first ramp signal. Because the second ramp signal is earlier in the falling point than the first ramp signal, the voltage level of the analog signal may be equal to a voltage level of the second ramp signal, at a time point at which the analog signal does not sufficiently decrease. That is, only the linear signal of the analog signal may undergo analog-to-digital conversion by using the second ramp signal.

The analog-to-digital conversion range of FIG. 13C may be a range including only the log signal (e.g., excluding the linear signal). For example, the analog signal may be compared with a third ramp signal, which has the same slope as the first ramp signal but is lower in the ramping start voltage level than the first ramp signal. Because the third ramp signal is lower in the ramping start voltage level than the first ramp signal, the voltage level of the analog signal (that is, the voltage level of the linear signal), which is higher than an initial voltage level of the third ramp signal, may not be included in the analog-to-digital conversion range. That is, only the log signal of the analog signal may undergo analog-to-digital conversion by using the third ramp signal.

Referring to FIGS. 1-2, 6A-6B, and 7, the ADC circuit 130 may generate a first digital signal based on the first analog signal (e.g., first pixel voltage Vout_1) read from a pixel PX based on photocharges accumulated during the first exposure time ET_1 and a first ramp signal and may generate a second digital signal based on the second analog signal (e.g., second pixel voltage Vout_2) and a second ramp signal. The first ramp signal may be different from the second ramp signal such that at least one of a ramping time of the first ramp signal or a ramping start voltage level of the first ramp signal is different from a corresponding one of a ramping time of the second ramp signal or a ramping start voltage level of the second ramp signal. For example, a falling point of the second ramp signal may be earlier than a falling point of the first ramp signal. For example, the first ramp signal may correspond to a conversion range shown in FIG. 13A that may comprise a linear signal of the first analog signal and a log signal of the first analog signal, while the second ramp signal may correspond to the conversion range shown in FIG. 13B that may comprise only a linear signal of the second analog signal. For example, the ADC circuit 130 may generate the first digital signal based on applying the first ramp signal to perform analog-to-digital conversion of both the linear and log signals of the first analog signal and may generate the second digital signal based on applying the second ramp signal to perform analog-to-digital conversion of only the log signal of the second analog signal. The image signal processor 150 may then generate image data (e.g., an HDR image of a dark object against a bright background) based on both the first digital signal (e.g., corresponding to a bright background of the image) and the second digital signal (e.g., corresponding to a dark object in the image).

The aforementioned method of converting the analog signal into the digital signal by varying the analog-to-digital conversion range is only a portion of some example embodiments, and the inventive concepts are not limited to the aforementioned method.

Figure 14:
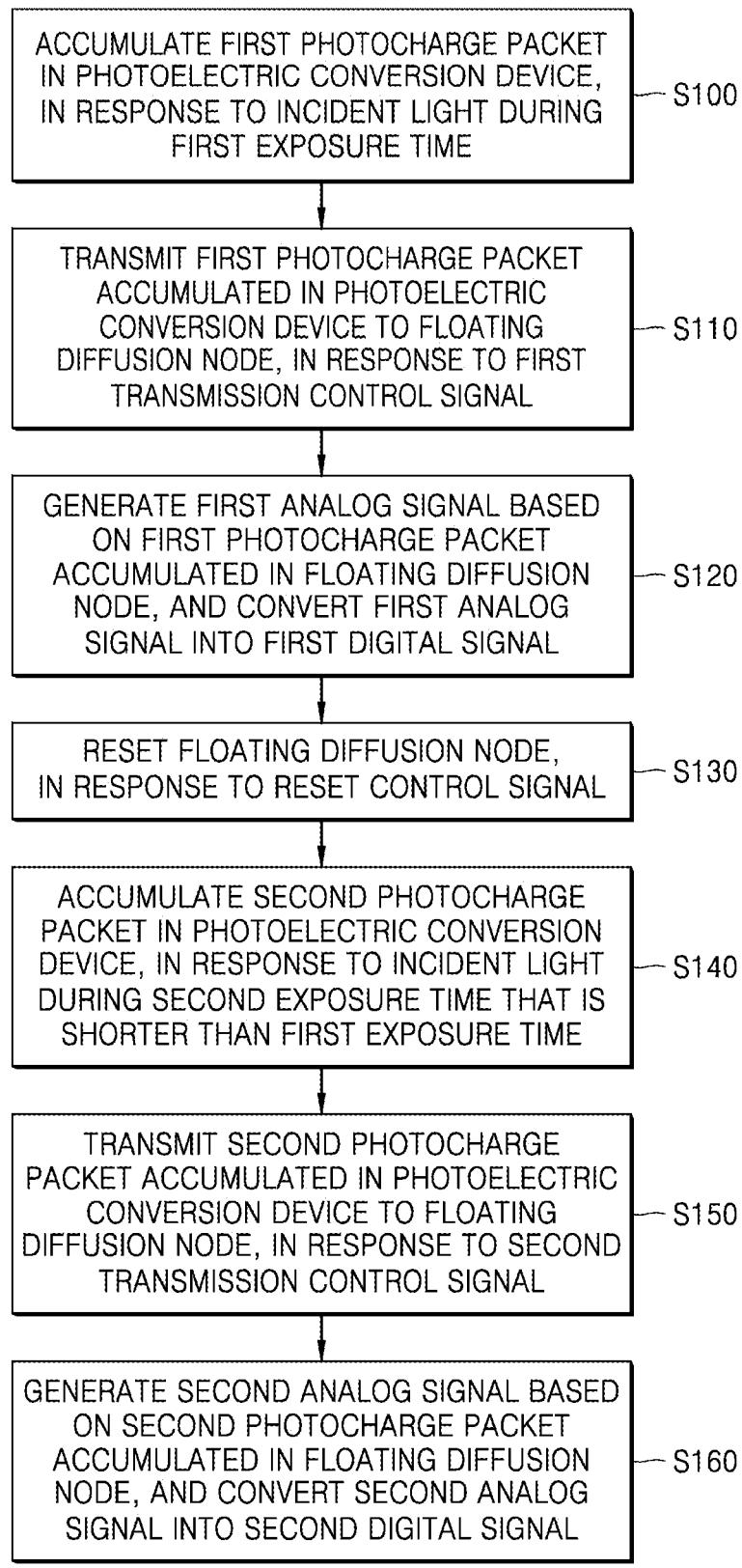
FIG. 14 is a flowchart illustrating a method of operating an image sensor, according to some example embodiments.

FIG. 14 is a flowchart illustrating a method of operating an image sensor, according to some example embodiments.

The method of FIG. 14 relates to a method of operating the image sensor 100 for generating the first analog signal, which includes a linear signal and a log signal, and the second analog signal, which includes a linear signal. The method of FIG. 14 may be understood with reference to FIG. 7.

A first photocharge packet may accumulate in a photoelectric conversion device (that is, PD), in response to incident light during the first exposure time ET_1 (S100). Before the first exposure time ET_1, there may be the first reset period RST_1. The first photocharge packet may refer to a set of photocharges accumulated (the first quantity of charge accumulated) in the photodiode PD during the first exposure time ET_1. Likewise, a second photocharge packet described below may refer to a set of photocharges accumulated (the second quantity of charge accumulated) in the photodiode PD during the second exposure time ET_2.

The first photocharge packet accumulated in the photoelectric conversion device (that is, PD) may be transmitted to the floating diffusion node FD, in response to the first transmission control signal TG_1 (S110). The first transmission control signal TG_1 may be lower in voltage level than the intrinsic potential barrier Vpb_0, and only a portion of the first photocharge packet may move to the floating diffusion node FD by applying the first transmission control signal TG_1 to the transmission transistor TX.

The first analog signal may be generated based on the first photocharge packet accumulated in the floating diffusion node FD and may be converted into a first digital signal (S120). The first analog signal may include a Lin-Log signal.

The floating diffusion node FD may be reset in response to the reset control signal RG (S130). The first photocharge packet accumulated in the floating diffusion node FD may be removed by the pixel power supply voltage VDD.

The second photocharge packet may accumulate in the photoelectric conversion device (that is, PD), in response to incident light during the second exposure time ET_2 that is shorter than the first exposure time ET_1 (S140). The second exposure time ET_2 may be shorter than the first exposure time ET_1. Therefore, the quantity of second photocharge packet may be less than the quantity of first photocharge packet.

The second photocharge packet accumulated in the photoelectric conversion device (that is, PD) may be transmitted to the floating diffusion node FD, in response to the second transmission control signal TG_2 (S150).

The second analog signal may be generated based on the second photocharge packet accumulated in the floating diffusion node FD and may be converted into a second digital signal (S160). The second analog signal may include a linear signal.

The first digital signal may be obtained by performing analog-to-digital conversion on the linear signal and the log signal of the first analog signal, and the second digital signal may be obtained by performing analog-to-digital conversion on the linear signal of the second analog signal (e.g., on only the linear signal of the second analog signal and not on any log signal of the second analog signal).

Figure 15:
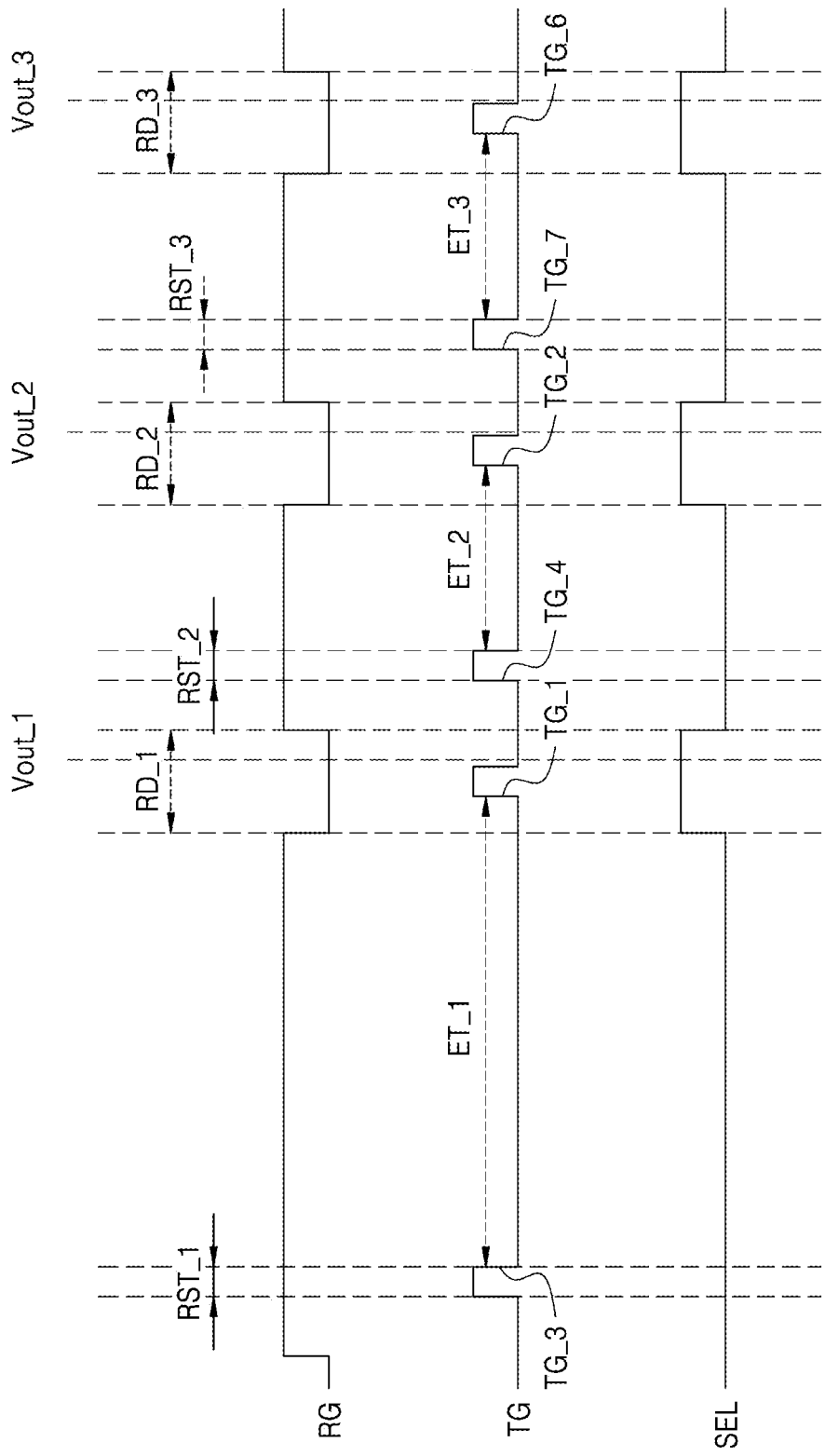
FIG. 15 illustrates a timing diagram of a pixel of an image sensor, according to some example embodiments.

FIG. 15 illustrates a timing diagram of an operation of a pixel of an image sensor, according to some example embodiments.

Specifically, FIG. 15 is a timing diagram for the transmission control signal TG, the reset control signal RG, and the select control signal SEL respectively applied to the transmission transistor TX, the reset transistor RX, and the select transistor SX, which are included in the pixel PX. Repeated descriptions given above regarding FIGS. 7, 8, 9, and 10 may be omitted.

The timing diagram of FIG. 15 may be described with reference to the timing diagram of FIG. 8. The timing diagram of FIG. 15 may be obtained by adding a third readout period RD_3 and a third reset period RST_3 to the timing diagram of FIG. 8. The third reset period RST_3 may be after the second readout period RD_2.

In the third reset period RST_3, a seventh transmission control signal TG_7 and the reset control signal RG may be at the active level, and the select control signal SEL may be at the inactive level. Because the seventh transmission control signal TG_7 and the reset control signal RG are at the active level, the transmission transistor TX and the reset transistor RX may be turned on, and the pixel power supply voltage VDD may be applied to the photodiode PD and the floating diffusion node FD due to the turn-on of the transmission transistor TX and the reset transistor RX. Photocharges generated during the second exposure time ET_2 and then remaining in the photodiode PD and the floating diffusion node FD may be removed by the pixel power supply voltage VDD, and thus, the photodiode PD and the floating diffusion node FD may be reset before the third exposure time ET_3.

The pixel PX may be exposed from a time point at which the seventh transmission control signal TG_7 transits from the active level to the inactive level until a time point at which a sixth transmission control signal TG_6 transits from the inactive level to the active level. That is, the pixel PX may be exposed to incident light during the third exposure time ET_3. Because the transmission control signal TG is at the inactive level during the third exposure time ET_3, the transmission transistor TX may be turned off, and photocharges accumulated in the photodiode PD in response to incident light that is incident during the third exposure time ET_3 may be unable to move to the floating diffusion node FD and may accumulate in the photodiode PD. For example, photocharges may accumulate in the photodiode PD in response to incident light that is incident during the third exposure time ET_3 in a high-illuminance environment, and the photodiode PD may be in the supersaturation state due to the quantity of charge accumulated. That is, the third exposure time ET_3 may be longer than the second exposure time ET_2.

In the third readout period RD_3, the reset control signal RG may be at the inactive level, and the sixth transmission control signal TG_6 and the select control signal SEL may be at the active level. In the third readout period RD_3, because the reset control signal RG is at the inactive level, the floating diffusion node FD may be cut off from the pixel power supply voltage VDD. The transmission transistor TX may be turned on in response to the sixth transmission control signal TG_6, and the photocharges generated during the third exposure time ET_3 and accumulated in the photodiode PD may move to the floating diffusion node FD due to the turn-on of the transmission transistor TX and may accumulate in the floating diffusion node FD. The select transistor SX may be turned on in response to the select control signal SEL, and a third pixel voltage Vout_3 based on the photocharges accumulated in the floating diffusion node FD may be read as a third analog signal by the ADC circuit 130 (see FIG. 1). The third analog signal based on the photocharges accumulated in the photodiode PD during the third exposure time ET_3 may include a linear signal and a log signal.

One piece of image data generated based on the first analog signal, the second analog signal, and the third analog signal may be an HDR image including no gray edge artifacts, reduced gray artifacts, or minimized gray artifacts, such that the image sensor 100 implementing the method according to any of the example embodiments may exhibit improved performance based on generating HDR images (e.g., HDR images of dark objects against a bright background) having fewer, minimized, or no gray artifacts and thus generating HDR images having improved quality. Referring to the example described above, an image of the bright background blocked by the dark object may be obtained by using the third analog signal.

Figure 16:
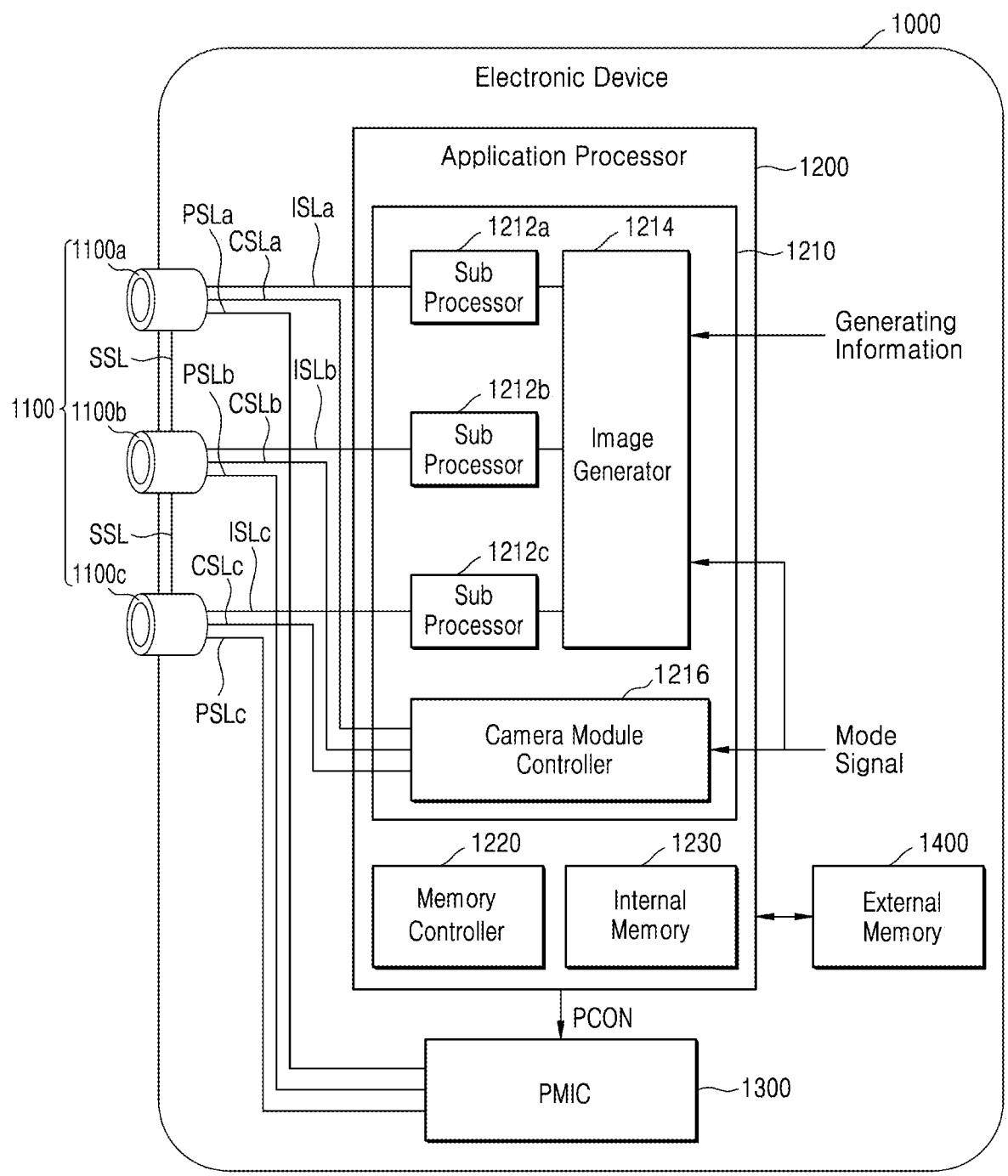
FIG. 16 is a block diagram of an electronic device including multiple camera modules, according to some example embodiments.
Figure 17:
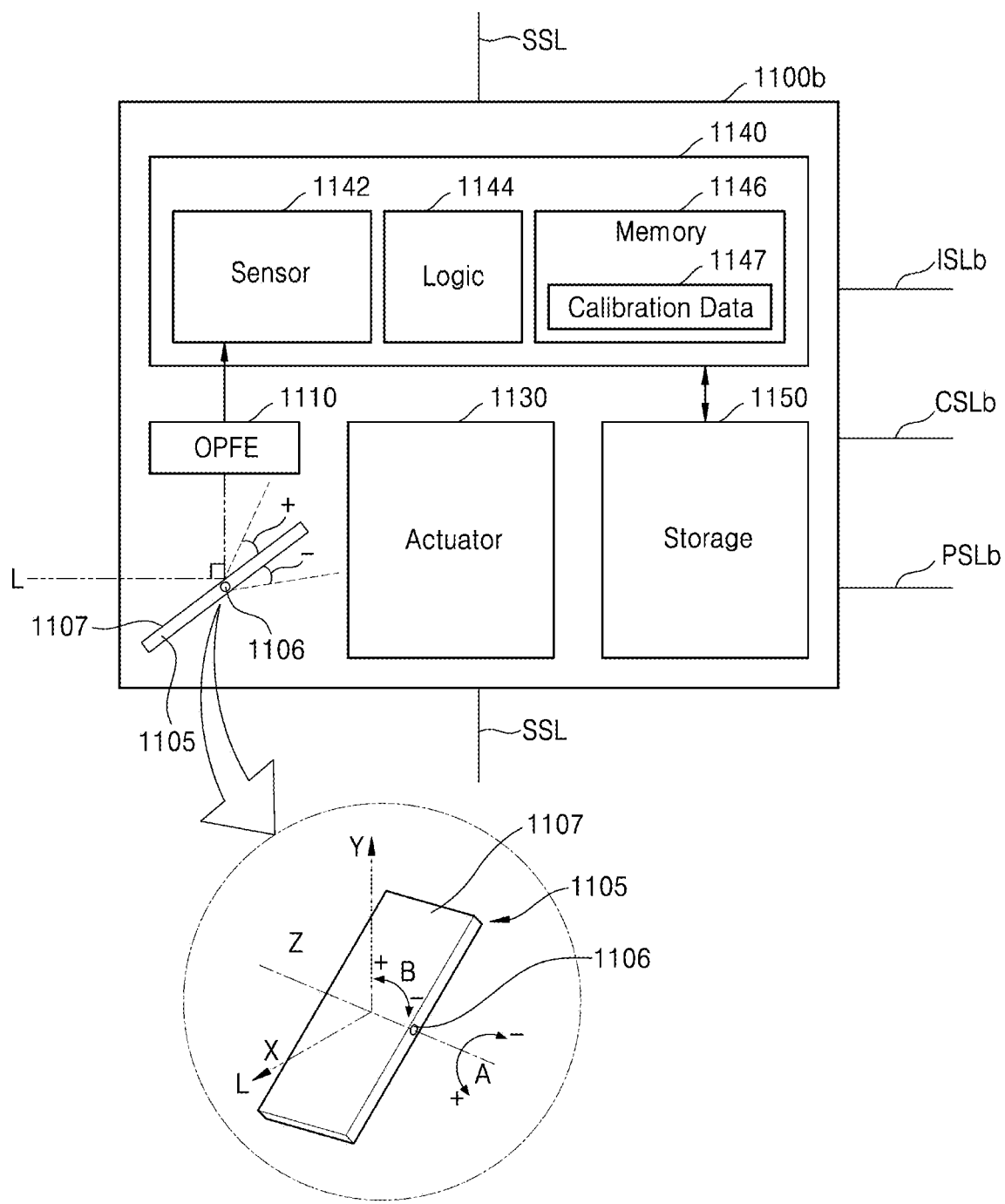
FIG. 17 is a detailed block diagram of a camera module of FIG. 16, according to some example embodiments.

FIG. 16 is a block diagram of an electronic device including multiple camera modules according to some example embodiments. FIG. 17 is a detailed block diagram of a camera module of FIG. 16 according to some example embodiments.

Referring to FIG. 16, an electronic device 1000 may include a camera module group 1100, an application processor 1200, a PMIC 1300, and an external memory 1400.

The camera module group 1100 may include a plurality of camera modules 1100a, 1100b, and 1100c, also referred to herein interchangeably as cameras, camera devices, or the like. The image sensor 100 may be included in each of the camera modules 1100a, 1100b, and 1100c. Although FIG. 16 illustrates an example in which three camera modules 1100a, 1100b, and 1100c are arranged, the inventive concepts are not limited thereto. In some example embodiments, the camera module group 1100 may be modified to include only two camera modules. In addition, in some example embodiments, the camera module group 1100 may be modified to include k camera modules (where k is a natural number equal to or greater than 4).

Although a configuration of the camera module 1100b is described below in more detail with reference to FIG. 17, the following description may also be equally applied to the other camera modules 1100a and 1100c depending on embodiments.

Referring to FIG. 17, the camera module 1100b may include a prism 1105, an optical path folding element (OPFE) 1110, an actuator 1130, an image sensing device 1140, and a storage 1150.

The prism 1105 may include a reflective surface 1107 of a light reflecting material and thus modify a path of light L incident from outside thereof.

In some example embodiments, the prism 1105 may change the path of the light L incident in a first direction (X direction) to a second direction (Y direction) that is perpendicular to the first direction (X direction). In addition, the prism 1105 may change the path of the light L incident in the first direction (X direction) to the second direction (Y direction) that is perpendicular to the first direction (X direction), by rotating the reflective surface 1107 of the light reflecting material in the A direction about a central axis 1106, or by rotating the central axis 1106 in the B direction. Here, the OPFE 1110 may also move in a third direction (Z direction) that is perpendicular to the first direction (X direction) and the second direction (Y direction).

In some example embodiments, as shown in FIG. 17, a maximum rotation angle of the prism 1105 in the A direction may be equal to or less than about 15 degrees in the +A direction and greater than about 15 degrees in the—A direction, but the inventive concepts are not limited thereto.

In some example embodiments, the prism 1105 may move at an angle of about 20 degrees, about 10 degrees to about 20 degrees, or about 15 degrees to about 20 degrees in the + or −B direction, and here, the respective moving angles of the prism 1105 in the + and −B directions may be equal to each other or be almost similar to each other with a difference of about 1 degree.

In some example embodiments, the prism 1105 may allow the reflective surface 1107 of the light reflecting material to be moved in the third direction (for example, the Z direction) that is parallel to an extension direction of the central axis 1106.

The OPFE 1110 may include, for example, a group of m optical lenses (where m is a natural number). The m optical lenses may change an optical zoom ratio of the camera module 1100b by moving in the second direction (Y direction). For example, assuming that a basic optical zoom ratio of the camera module 1100b is Z, when the m optical lenses of the OPFE 1110 are moved, the optical zoom ratio of the camera module 1100b may be changed to 3Z or 5Z or more.

The actuator 1130 may move the OPFE 1110 or an optical lens to a specific position. For example, the actuator 1130 may adjust a position of the optical lens such that the image sensor 1142 is located at a focal length of the optical lens, for accurate sensing.

The image sensing device 1140 may include the image sensor 1142, control logic 1144, and a memory 1146. The image sensor 1142 may sense an image of a sensing object by using the light L provided through the optical lens.

The control logic 1144 may control overall operations of the camera module 1100b. For example, the control logic 1144 may control an operation of the camera module 1100b according to a control signal provided through a control signal line CSLb. In addition, the control logic 1144 may control the first exposure time ET_1, the second exposure time ET_2, the voltage level of the first transmission control signal TG_1, or the like.

The memory 1146 may store information required for operations of the camera module 1100b, such as calibration data 1147. The calibration data 1147 may include information required for the camera module 1100b to generate image data by using the light L provided from outside thereof. The calibration data 1147 may include, for example, information about a degree of rotation described above, information about a focal length, information about an optical axis, or the like. When the camera module 1100b is implemented in the form of a multi-state camera in which a focal length varies with a position of the optical lens, the calibration data 1147 may include a value of a focal length for each position (or for each state) of the optical lens and information related to auto focusing.

The storage 1150 may store image data sensed by the image sensor 1142. The storage 1150 may be arranged outside the image sensing device 1140 and may be implemented in a stacked form together with a sensor chip constituting the image sensing device 1140. In some example embodiments, the storage 1150 may be implemented by electrically erasable programmable read-only memory (EEPROM), but the inventive concepts are not limited thereto.

Referring together to FIGS. 16 and 17, in some example embodiments, each of the plurality of camera modules 1100a, 1100b, and 1100c may include the actuator 1130. Therefore, the plurality of camera modules 1100a, 1100b, and 1100c may respectively include pieces of calibration data 1147, which are equal to each other or different from each other, according to an operation of the actuator 1130 included therein.

In some example embodiments, one camera module (for example, 1100b) of the plurality of camera modules 1100a, 1100b, and 1100c may include a folded lens type camera module including the prism 1105 and the OPFE 1110, which are described above, and the other camera modules (for example, 1100a and 1100c) may include vertical type camera modules not including the prism 1105 and the OPFE 1110, but the inventive concepts are not limited thereto.

In some example embodiments, one camera module (for example, 1100c) of the plurality of camera modules 1100a, 1100b, and 1100c may include, for example, a vertical type depth camera that extracts depth information by using an infrared ray (IR). In this case, the application processor 1200 may generate a 3-dimensional (3D) depth image by merging image data provided by such a depth camera with image data provided by another camera module (for example, 1100a or 1100b).

In some example embodiments, at least two camera modules (for example, 1100a and 1100b) of the plurality of camera modules 1100a, 1100b, and 1100c may have different fields of view from each other. In this case, for example, at least two camera modules (for example, 1100a and 1100b) of the plurality of camera modules 1100a, 1100b, and 1100c may include different optical lenses from each other, but the inventive concepts are not limited thereto.

In addition, in some example embodiments, the plurality of camera modules 1100a, 1100b, and 1100c may respectively have different fields of view. In this case, the respective optical lenses of the plurality of camera modules 1100a, 1100b, and 1100c may also be different from each other, but the inventive concepts are not limited thereto.

In some example embodiments, the plurality of camera modules 1100a, 1100b, and 1100c may be respectively arranged to be physically separate from each other. That is, the plurality of camera modules 1100a, 1100b, and 1100c may respectively include independent image sensors 1142 arranged therein rather than respectively use divided portions of a sensing area of one image sensor 1142.

Referring again to FIG. 16, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be separately implemented by separate semiconductor chips from each other, respectively.

The image processing device 1210 may include a plurality of sub-image processors 1212a, 1212b, and 1212c, an image generator 1214, and a camera module controller 1216.

The image processing device 1210 may include the plurality of sub-image processors 1212a, 1212b, and 1212c in a number corresponding to the number of camera modules 1100a, 1100b, and 1100c.

Pieces of image data respectively generated by the plurality of camera modules 1100a, 1100b, and 1100c may be respectively provided to the sub-image processors 1212a, 1212b, and 1212c corresponding thereto through image signal lines ISLa, ISLb, and ISLc separate from each other. For example, the image data generated by the camera module 1100a may be provided to the sub-image processor 1212a through the image signal line ISLa, the image data generated by the camera module 1100b may be provided to the sub-image processor 1212b through the image signal line ISLb, and the image data generated by the camera module 1100c may be provided to the sub-image processor 1212c through the image signal line ISLc. Such image data transmission may be performed by using a camera serial interface (CSI) that is based on Mobile Industry Processor Interface (MIPI), but the inventive concepts are not limited thereto.

In some example embodiments, one sub-image processor may be arranged to correspond to a plurality of camera modules. For example, the sub-image processor 1212a and the sub-image processor 1212c may be implemented to be integrated into one sub-image processor rather than implemented separately from each other as shown in FIG. 16, and the pieces of image data respectively provided by the camera module 1100a and the camera module 1100c may be selected by a selection device (for example, a multiplexer) or the like and then provided to the integrated sub-image processor.

The pieces of image data respectively provided to the sub-image processors 1212a, 1212b, and 1212c may be provided to the image generator 1214. The image generator 1214 may generate an output image by using the pieces of image data respectively provided by the sub-image processors 1212a, 1212b, and 1212c, according to image generating information or a mode signal.

Specifically, the image generator 1214 may generate the output image by merging at least some of the pieces of image data respectively generated by the camera modules 1100a, 1100b, and 1100c that have different fields of view from each other, according to the image generating information or the mode signal. In addition, the image generator 1214 may generate the output image by selecting one of the pieces of image data respectively generated by the camera modules 1100a, 1100b, and 1100c that have different fields of view from each other, according to the image generating information or the mode signal.

In some example embodiments, the image generating information may include a zoom signal (or zoom factor). In addition, in some example embodiments, the mode signal may be, for example, a signal that is based on a mode selected by a user.

When the image generating information corresponds to a zoom signal (zoom factor) and the camera modules 1100a, 1100b, and 1100c respectively have different fields of view, the image generator 1214 may perform a different operation depending on the type of zoom signal. For example, when the zoom signal is a first signal, image data output from the camera module 1100a is merged with image data output from the camera module 1100c, and then, an output image may be generated by using a merged image signal and image data that is output from the camera module 1100b and not used for the merging. When the zoom signal is a second signal that is different from the first signal, the image generator 1214 does not perform such image data merging and may generate an output image by selecting one of the pieces of image data respectively output from the camera modules 1100a, 1100b, and 1100c. However, embodiments of the inventive concepts are not limited thereto, and a method of processing image data may be modified in any way, as needed.

In some example embodiments, the image generator 1214 may receive a plurality of pieces of image data, which have different exposure times from each other, from at least one of the plurality of sub-image processors 1212a, 1212b, or 1212c and may perform HDR processing on the plurality of pieces of image data, thereby generating merged image data having an increased dynamic range.

The camera module controller 1216 may respectively provide control signals to the camera modules 1100a, 1100b, and 1100c. The control signals generated by the camera module controller 1216 may be respectively provided to the camera modules 1100a, 1100b, and 1100c corresponding thereto through the control signal lines CSLa, CSLb, CSLc that are separate from each other.

One of the plurality of camera modules 1100a, 1100b, or 1100c may be designated as a master camera (for example, 1100b) according to the image generating information including the zoom signal or according to the mode signal, and the other camera modules (for example, 1100a and 1100c) may be designated as slave cameras. Such information may be included in the control signal and may be provided to the camera modules 1100a, 1100b, and 1100c corresponding thereto through the control signal lines CSLa, CSLb, CSLc that are separate from each other, respectively.

The camera modules operating as masters and slaves may be changed according to the zoom factor or the mode signal. For example, when the field of view of the camera module 1100a is larger than the field of view of the camera module 1100b and the zoom factor indicates a low zoom ratio, the camera module 1100b may operate as a master, and the camera module 1100a may operate as a slave. On the other hand, when the zoom factor indicates a high zoom ratio, the camera module 1100a may operate as a master, and camera module 1100b may operate as a slave.

In some example embodiments, the control signal provided from the camera module controller 1216 to each of the camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b having received the sync enable signal may generate a sync signal based on the received sync enable signal and may provide the generated sync signal to the camera modules 1100a and 1100c through a sync signal line. The camera module 1100b and the camera modules 1100a and 1100c may be synchronized with the sync signal and thus transmit image data to the application processor 1200.

In some example embodiments, the control signal provided from the camera module controller 1216 to each of the plurality of camera modules 1100a, 1100b, and 1100c may include mode information according to the mode signal. Each of the plurality of camera modules 1100a, 1100b, and 1100c may operate in a first operation mode or a second operation mode in relation to a sensing speed, based on the mode information.

Each of the plurality of camera modules 1100a, 1100b, and 1100c may generate an image signal at a first rate (for example, generate an image signal with a first frame rate) in the first operation mode, may encode the image signal at a second rate that is higher than the first rate (for example, encode the image signal with a second frame rate that is higher than the first frame rate), and may transmit the encoded image signal to the application processor 1200. Here, the second rate may be equal to or less than 30 times the first rate.

The application processor 1200 may store the received image signal, in other words, the encoded image signal, in the internal memory 1230 that is internal to the application processor 1200 or in the external memory 1400 that is external to the application processor 1200, followed by reading the encoded image signal from the internal memory 1230 or the external memory 1400 and decoding the encoded image signal, and then, may display image data generated based on the decoded image signal. For example, a sub-image processor corresponding to the encoded image signal from among the plurality of sub-image processors 1212a, 1212b, and 1212c of the image processing device 1210 may perform decoding and may also perform image processing on the decoded image signal.

Each of the plurality of camera modules 1100a, 1100b, and 1100c may generate an image signal at a third rate that is lower than the first rate (for example, generate an image signal with a third frame rate that is lower than the first frame rate) in the second operation mode and may transmit the image signal to the application processor 1200. The image signal provided to the application processor 1200 may be a signal that is not encoded. The application processor 1200 may perform image processing on the image signal, which is received, or may store the image signal in the internal memory 1230 or the external memory 1400.

The PMIC 1300 may supply power, for example, a power supply voltage, to each of the plurality of camera modules 1100a, 1100b, and 1100c. For example, the PMIC 1300 may supply first power to the camera module 1100a through a power signal line PSLa, supply second power to the camera module 1100b through a power signal line PSLb, and supply third power to the camera module 1100b through a power signal line PSLc, under the control of the application processor 1200.

The PMIC 1300 may generate power corresponding to each of the plurality of camera modules 1100a, 1100b, and 1100c and adjust a level of power, in response to a power control signal PCON from the application processor 1200. The power control signal PCON may include a power adjusting signal for each operation mode of each of the plurality of camera modules 1100a, 1100b, and 1100c. For example, the operation mode may include a low power mode, and here, the power control signal PCON may include information about a camera module operating in the low power mode and about a power level to be set. The levels of power respectively provided to the plurality of camera modules 1100a, 1100b, and 1100c may be equal to each other or different from each other. In addition, the level of power may be dynamically changed.

As described herein, any devices, electronic devices, modules, units, and/or portions thereof according to any of the example embodiments, and/or any portions thereof (including, without limitation, the image sensor 100, the pixel array 110, the row driver 120, the ADC circuit 130, the timing controller 140, the image signal processor 150, the electronic device 1000, the application processor 1200, the image processing device 1210, the image generator 1214, sub-image processors 1212a, 1212b, 1212c, the camera module controller 1216, the memory controller 1220, the PMIC 1300, the external memory 1400, the internal memory 1230, the actuator 1130, the image sensing device 1140, the control logic 1144, the image sensor 1142, the memory 1146, the storage 1150, the OPFE 1110, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

Any of the memories described herein, including, without limitation, the internal memory 1230, the external memory 1400, the memory 1146, and/or the storage 1150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (Re-RAM), or a ferro-electric RAM (FRAM), or a volatile memory, such as a static RAM (SRAM), a dynamic RAM (DRAM), or a synchronous DRAM (SDRAM).

While the inventive concepts have been particularly shown and described with reference to some example embodiments thereof, it will be understood that various changes in form and details may be made therein without departing from the spirit and scope of the following claims.

What is claimed is:

1. An image sensor, comprising:
a pixel array including a plurality of pixels;
an analog-to-digital conversion circuit configured to receive an analog signal from the plurality of pixels and transmit a digital signal; and
an image signal processor configured to receive the digital signal and generate image data,
wherein at least one pixel of the plurality of pixels is configured to
generate a first analog signal based on a first quantity of charge accumulated at the at least one pixel during a first exposure time, and
generate a second analog signal based on a second quantity of charge accumulated at the at least one pixel during a second exposure time that is shorter than the first exposure time,
wherein the analog-to-digital conversion circuit is further configured to
generate a first digital signal based on the first analog signal and a first ramp signal, and
generate a second digital signal based on the second analog signal and a second ramp signal,
wherein the image signal processor is further configured to generate the image data based on the first digital signal and the second digital signal, and
wherein the first ramp signal is different from the second ramp signal such that at least one of a ramping time of the first ramp signal or a ramping start voltage level of the first ramp signal is different from a corresponding one of a ramping time of the second ramp signal or a ramping start voltage level of the second ramp signal.

2. The image sensor of claim 1, wherein a conversion range of the first analog signal into the first digital signal is larger than a conversion range of the second analog signal into the second digital signal.

3. The image sensor of claim 2, wherein
the conversion range of the first analog signal into the first digital signal comprises a linear signal of the first analog signal and a log signal of the first analog signal, and
the conversion range of the second analog signal into the second digital signal comprises only a linear signal of the second analog signal.

4. The image sensor of claim 1, wherein the first analog signal and the second analog signal are generated by the plurality of pixels based on a staggered method or a multi-frame method.

5. The image sensor of claim 1, further comprising a timing controller configured to control operations of the plurality of pixels and the analog-to-digital conversion circuit,
wherein the at least one pixel of the plurality of pixels comprises a transmission transistor, a reset transistor, and a floating diffusion node, and
wherein the timing controller is further configured to:
sequentially turn on the transmission transistor in each of a first reset period, a first readout period, and a second readout period such that the first readout period is subsequent to the first reset period and prior to the second readout period,
control the analog-to-digital conversion circuit to generate the first digital signal based on performing analog-to-digital conversion on the first analog signal, in the first readout period after the first exposure time subsequent to the first reset period, and
control the analog-to-digital conversion circuit to generate the second digital signal based on performing analog-to-digital conversion on the second analog signal, in the second readout period after the second exposure time subsequent to the first readout period.

6. The image sensor of claim 5, wherein
the timing controller is further configured to turn on the transmission transistor in a second reset period, and the second reset period is located between the first readout period and a starting point of the second exposure time.

7. The image sensor of claim 5, wherein
the timing controller is further configured to turn on the transmission transistor and turn off the reset transistor, in a remaining reset period, and
the remaining reset period is located between the first reset period and a starting point of the first exposure time.

8. The image sensor of claim 6, wherein a turn-on voltage of the transmission transistor in the first readout period is lower than a turn-on voltage of the transmission transistor in the second readout period.

9. The image sensor of claim 1, wherein
the at least one pixel of the plurality of pixels is further configured to generate a third analog signal based on a third quantity of charge that is accumulated at the at least one pixel based on a third exposure time,
the third exposure time is longer than the second exposure time,
the analog-to-digital conversion circuit is further configured to generate a third digital signal based on the third analog signal and a third ramp signal, and
the image signal processor is further configured to generate the image data based on the first digital signal, the second digital signal, and the third digital signal.

10. The image sensor of claim 9, wherein the second exposure time is after the first exposure time and before the third exposure time.

11. A method of operating an image sensor, the method comprising:
accumulating a first photocharge packet in a photoelectric conversion device, in response to incident light during a first exposure time;
transmitting the first photocharge packet accumulated in the photoelectric conversion device to a floating diffusion node, in response to a first transmission control signal;
generating a first analog signal based on the first photocharge packet, which is accumulated in the floating diffusion node, and converting the first analog signal into a first digital signal;
resetting the floating diffusion node, in response to a reset control signal;
accumulating a second photocharge packet in the photoelectric conversion device, in response to incident light during a second exposure time that is shorter than the first exposure time;
transmitting the second photocharge packet accumulated in the photoelectric conversion device to the floating diffusion node, in response to a second transmission control signal; and
generating a second analog signal based on the second photocharge packet, which is accumulated in the floating diffusion node, and converting the second analog signal into a second digital signal,
wherein the converting the first analog signal into the first digital signal includes performing analog-to-digital conversion on a linear signal of the first analog signal and a log signal of the first analog signal, and the converting the second analog signal into the second digital signal includes performing analog-to-digital conversion on only a linear signal of the second analog signal.

12. The method of claim 11, wherein
a first ramp signal and a second ramp signal are respectively used in the converting the first analog signal into the first digital signal and in the converting the second analog signal into the second digital signal, and
a falling point of the second ramp signal is earlier than a falling point of the first ramp signal.

13. The method of claim 11, wherein the resetting of the floating diffusion node further comprises:
turning on a transmission transistor in response to a third transmission control signal generated after the first transmission control signal is generated and before the second transmission control signal is generated; and
resetting the photoelectric conversion device.

14. The method of claim 11, wherein a first voltage level of the first transmission control signal is lower than a second voltage level of the second transmission control signal.

15. The method of claim 11, further comprising:
generating a third analog signal, based on a third photocharge packet generated in response to incident light during a third exposure time; and
converting the third analog signal into a third digital signal,
wherein the third analog signal comprises a Lin-Log signal.

16. The method of claim 15, wherein a conversion range of the third analog signal into the third digital signal comprises a linear signal of the third analog signal and a log signal of the third analog signal.

17. The method of claim 15, wherein the second exposure time is after the first exposure time and before the third exposure time.

18. An image processing device, comprising:
an image sensor configured to
generate a first analog signal based on a first quantity of charge accumulated at the image sensor during a first exposure time,
generate a second analog signal based on a second quantity of charge accumulated at the image sensor during a second exposure time,
generate a first digital signal in a first readout period based on the first analog signal, and
generate a second digital signal in a second readout period based on the second analog signal; and
an image signal processor configured to generate image data based on the first digital signal and the second digital signal,
wherein the image sensor comprises a photoelectric conversion device,
wherein the first digital signal is generated based on a log signal of the first analog signal and a linear signal of the first analog signal, and
wherein the second digital signal is generated based on only a linear signal of the second analog signal.

19. The image processing device of claim 18, wherein the first exposure time is longer than the second exposure time.

20. The image processing device of claim 18, wherein
the image sensor further comprises a transmission transistor, and
a first voltage level applied to a gate of the transmission transistor in the first readout period is lower than a second voltage level applied to the gate of the transmission transistor in the second readout period.

* * * * *